US009542508B2

(12) United States Patent
Altundas et al.

(10) Patent No.: US 9,542,508 B2
(45) Date of Patent: Jan. 10, 2017

(54) MODEL BASED INVERSION OF SEISMIC RESPONSE FOR DETERMINING FORMATION PROPERTIES

(75) Inventors: Yusuf Altundas, Cambridge, MA (US); Terizhandur S. Ramakrishnan, Boxborough, MA (US); Satish C. Singh, Paris (FR); Manuel Queiser, Paris (FR); Junlun Li, Cambridge, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 795 days.

(21) Appl. No.: 13/882,423

(22) PCT Filed: Oct. 28, 2011

(86) PCT No.: PCT/US2011/058445
§ 371 (c)(1),
(2), (4) Date: Jul. 15, 2013

(87) PCT Pub. No.: WO2012/058626
PCT Pub. Date: May 3, 2012

(65) Prior Publication Data
US 2013/0297273 A1    Nov. 7, 2013

Related U.S. Application Data

(60) Provisional application No. 61/408,272, filed on Oct. 29, 2010.

(51) Int. Cl.
*G06G 7/48* (2006.01)
*G06F 17/50* (2006.01)
(Continued)

(52) U.S. Cl.
CPC ........... *G06F 17/5009* (2013.01); *G01V 1/282* (2013.01); *G01V 1/30* (2013.01); *G01V 2210/614* (2013.01); *G01V 2210/67* (2013.01)

(58) Field of Classification Search
CPC ........................................................ G01V 1/30
(Continued)

(56) References Cited

U.S. PATENT DOCUMENTS 6,662,109 B2    12/2003    Roggero et al.
7,191,071 B2    3/2007    Kfoury et al.
(Continued)

FOREIGN PATENT DOCUMENTS

WO    2009082605    7/2009
WO    2009140056    11/2009

OTHER PUBLICATIONS

International Search Report of PCT Application No. PCT/US2011/058445 dated Feb. 1, 2012: pp. 1-2.
(Continued)

*Primary Examiner* — Hugh Jones
(74) *Attorney, Agent, or Firm* — Jakub Michna

(57) ABSTRACT

A method for characterizing a property of a subterranean formation including collecting well log and seismic data, inverting the data, processing for upscaled petrophysical parameters, constructing a flow model that generates saturation, pressure and temperature, constructing seismic velocity relationships from the results of the flow model, and constructing a seismic model. Some embodiments may form a full waveform model or a ray tracing model. Some embodiments may generate a velocity profile and/or waveforms using the profile. Some embodiments may use the parameters to form a reservoir model or to recover hydrocarbons from the formations. Some embodiments build a reservoir model of $CO_2$ injection or $CO_2$ presence after injection or for simulating $CO_2$ presence in a subterranean formation. Some embodiments may also quantify $CO_2$ prop-
(Continued)

erties in the reservoir or predict $CO_2$ profile evolution over time in the reservoir including spatial distribution. Some embodiments may also predict $CO_2$ profile evolution over time in a reservoir and risk assessment, estimate storage capacity of the reservoir, or select a storage site. Some additional embodiments may also predict fluid front arrival, fluid front monitoring, fluid movement monitoring, or injectivity. Some additional embodiments may generate saturation profiles or a pressure.

22 Claims, 21 Drawing Sheets

(51) Int. Cl.
*G01V 1/28* (2006.01)
*G01V 1/30* (2006.01)

(58) Field of Classification Search
USPC .......................................................... 703/10
See application file for complete search history.

(56) References Cited

U.S. PATENT DOCUMENTS

2002/0120429 A1   8/2002   Ortoleva
2009/0070086 A1   3/2009   Le Ravalee et al.
2009/0164188 A1   6/2009   Habashy et al.

OTHER PUBLICATIONS

Debarros et al., "Full waveform inversion of seismic waves reflected in a stratified porous medium," Geophysical Journal International, 2010, vol. 182(3): pp. 1543-1556.

Gandomi et al., "Assessing Monitorability of CO2 saturation in subsurface aquifers," SEG Denver Annual Meeting, 2010: pp. 2703-2708.

Gosselet et al., "Abstract #H12D-07: Monotoring of CO2 sequestration at Sleipner using full waveform inversion in time-lapse mode," AGU, 2007, vol. 88(52): pp. 1-2.

Keers et al., "Determination of Porosity and Saturation Using Seismic Waveform Inversion," Stud. Geophys. Geod., 2007, vol. 51: pp. 119-140.

Vasco et al., "Seismic imaging of reservoir flow properties: Resolving water influx and reservoir permeability," Geophysics, Jan.-Feb. 2008, vol. 73(1): pp. O1-O13.

MODEL BASED INVERSION OF SEISMIC RESPONSE FOR DETERMINING FORMATION PROPERTIES

CROSS-REFERENCE TO RELATED APPLICATIONS

This application is a United States National Stage Application under 35 U.S.C. §371 and claims priority to Patent Cooperation Treaty Application Number PCT/US2011/058445 filed Oct. 28, 2011, with the same title, which claims priority to U.S. Provisional Patent Application Ser. No. 61/408,272 filed Oct. 29, 2010, with the same title. Both of these applications are incorporated herein by reference in their entireties.

FIELD

Methods are described herein to estimate fluid saturation of subterranean formations and reservoir model updating.

BACKGROUND

The need for quantifying fluid saturation and updating reservoir models to honor available data has been an interest to oil and gas industry from a financial point of view for a long time. Underground $CO_2$ storage requires monitoring injected $CO_2$ to assure permanence and avoid the risk of contaminating natural resources underground.

Generally, petrophysical parameters are mostly inferred from bore-hole measurements only few inches away from the wellbore. Formation properties beyond the wellbore(s) are usually generated by geostatistical methods using data from wells. But geostatistical averaging techniques are unverifiable and a number of generated models will equally well represent the measurements. Therefore, they are incapable of resolving the variability in the formation. Deep reading surface seismic measurements can help obtaining information from the reservoir beyond the wellbore and improve the depth of the investigation but the resolution of the surface seismic measurements is low (>15 m). Therefore, they are not effective in determining fluid properties.

Crosswell seismic measurements are regularly used to enhance the resolution of the measurements and improve the characterization of the reservoir within wellbores. Determining geological layers and realization of the continuity of layer boundaries across the wellbores are possible with the crosswell seismic measurements. As for the application of crosswell seismic measurements in reservoir characterization, obtaining the petrophysical properties and quantification of the fluid in the reservoir are still challenging. Crosswell seismic data are commonly used to predict the plume shape of $CO_2$ by looking at the difference in velocity profiles obtained at different times. Effective velocities of the media is obtained from voxel based full waveform inversions of crosswell data without taking into account constraints in the variation in the gas/fluid properties (saturation, densities, compressibility etc) in the rock, e.g. by the dictates of the fluid displacement. Subsequent translation of the velocities into saturation is therefore a gross approximation of the fluid in the reservoir and may violate conservation principles of fluid mechanics. Furthermore, by nature, this inversion technique has non-unique characteristic. Accuracy of the solution of this type of problems depends highly on the initial guess and regularization. Besides, voxel based inversion of seismic data is computationally intensive despite the advent of computing technology, requiring millions of numerical grids. The velocities obtained from voxel-based inversion may be sufficient for differentiating gross fluid distribution profiles in the reservoir but not enough for inferring sharp transitions in seismic properties. In the best-case scenario, one can get an estimate of the shape of the plume of $CO_2$ but delineation that affects decisions.

SUMMARY

Embodiments relate to a method for characterizing a property of a subterranean formation including collecting well log and seismic data, inverting the data, processing for upscaled petrophysical parameters, constructing a flow model that generates saturation, pressure and temperature, constructing seismic velocity relationships from the results of the flow model, and constructing a seismic model. Some embodiments may form a full waveform model or a ray tracing model. Some embodiments integrate a flow model with detailed thermodynamical consideration and use a fluid substitution effective media calculations to generate synthetic velocity data. Some embodiments may form full waveform model or a ray tracing model. Some embodiments may generate a velocity profile and/or waveforms using the profile. Some embodiments may use the parameters to form a reservoir model or to recover hydrocarbons from the formations. Some embodiments build a reservoir model of $CO_2$ injection or $CO_2$ presence after injection or for simulating $CO_2$ presence in a subterranean formation. Some embodiments may also quantify $CO_2$ properties in the reservoir or predict $CO_2$ profile evolution over time in the reservoir including spatial distribution.

Some embodiments may also predict $CO_2$ profile evolution over time in a reservoir and risk assessment, estimate storage capacity of the reservoir, or select a storage site. Some additional embodiments may also predict fluid front arrival, fluid front monitoring, fluid movement monitoring, or injectivity. Some additional embodiments may generate saturation profile and a pressure profile or a saturation, pressure and temperature profiles.

FIGURES

Embodiments are described in reference to the attached figures. The same numbers are used throughout the drawings to reference like features and components.

FIGS. 1A-1F show sensitivity of waveforms (homogeneous case) to different petrophysical parameters when amplitude misfit is used a metric, at t=10 days. All perturbed models are compared with the reference model. For comparison, perturbation in waveforms when attenuation is included is also presented. The simulations for different Q use reference model petrophysical parameters for flow simulation.

FIGS. 2A-2F show sensitivity of waveforms (layered case) to different petrophysical parameters when travel time misfit is used a metric, at t=10 days. All perturbed models are compared with the reference model. For comparison, perturbation in waveforms when attenuation is included, is also presented. The simulations for different Q use reference model petrophysical parameters for flow simulation.

FIGS. 3A-3F show sensitivity of waveforms (homogeneous case) to different petrophysical parameters when travel time misfit is used a metric, at t=50 days. All perturbed models are compared with the reference model. For comparison, perturbation in waveforms when attenuation is included, is also presented. The simulations for different Q use reference model petrophysical parameters for flow simulation.

FIGS. 4A-4F show sensitivity of waveforms (layered case) to different petrophysical parameters when travel time misfit is used a metric, at t=50 days. All perturbed models are compared with the reference model. For comparison, perturbation in waveforms when attenuation is included, is also presented. The simulations for different Q use reference model petrophysical parameters for flow simulation.

FIGS. 5A and 5B are a series to show different arrivals in the seismogram are marked and described in the above two figures. The nomenclature is as follows: D, H, R or T indicates if the arrival is a direct, head, reflected or a transmitted wave, respectively. Superscripts indicate if it is a P or S wave. Subscripts indicate the medium the wave is reflected from or transmitted into. For multiply reflected or transmitted waves, the first letter indicates current state and the following letters indicate the previous states.

FIGS. 6A-6F illustrate a sensitivity of waveforms (homogeneous case) to different petrophysical parameters when travel time misfit is used a metric, at t=10 days. All perturbed models are compared with the reference model. For comparison, perturbation in waveforms when attenuation is included, is also presented. The simulations for different Q use reference model petrophysical parameters for flow simulation.

FIGS. 7A-7F illustrate a sensitivity of waveforms (homogeneous case) to different petrophysical parameters when waveform misfit is used a metric, at t=10 days. All perturbed models are compared with the reference model. For comparison, perturbation in waveforms when attenuation is included, is also presented. The simulations for different Q use reference model petrophysical parameters for flow simulation.

Figure 20A:
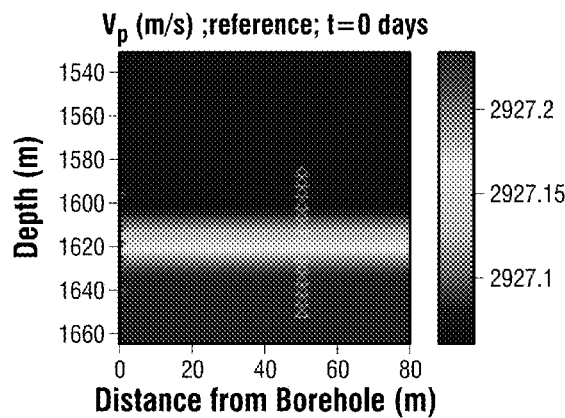
Figure 20B:
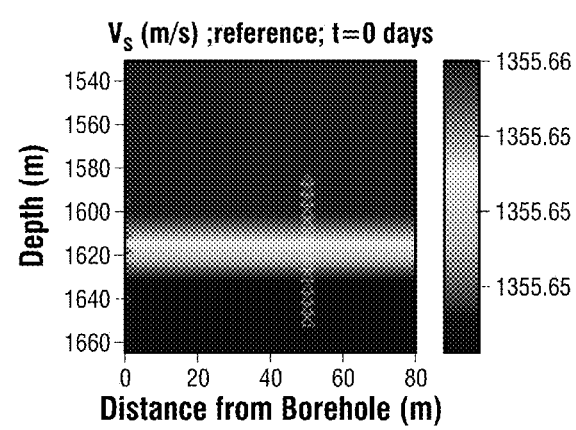
Figure 20C:
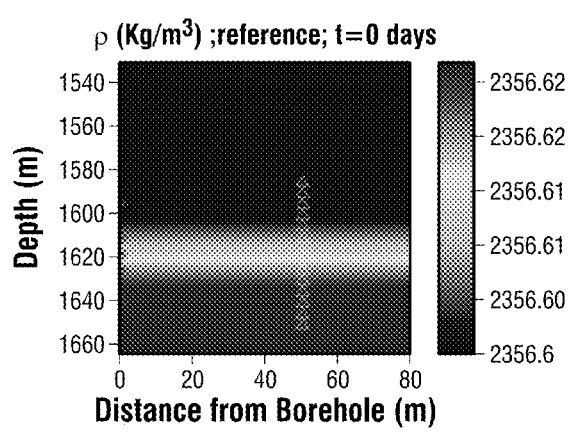
Figure 21A:
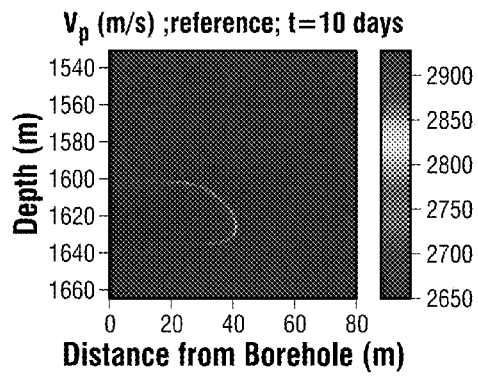
Figure 21B:
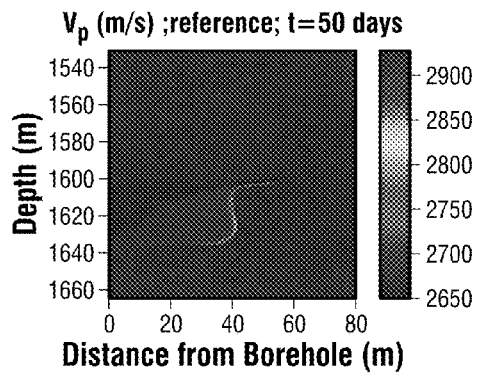
Figure 21C:
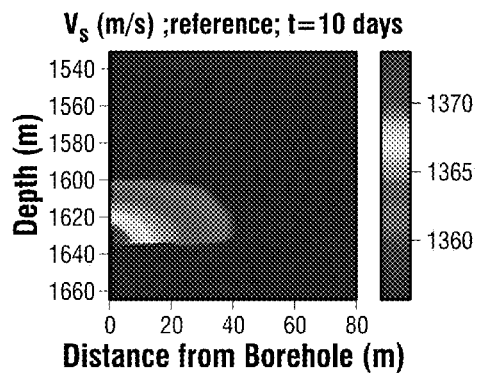
Figure 21D:
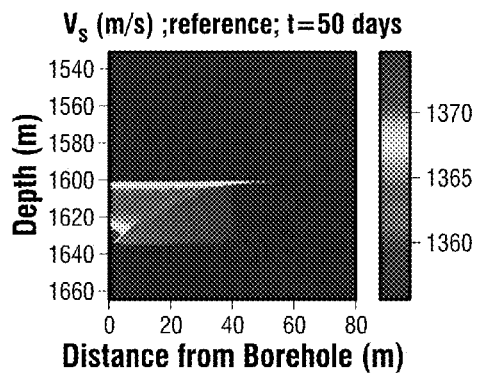
Figure 21E:
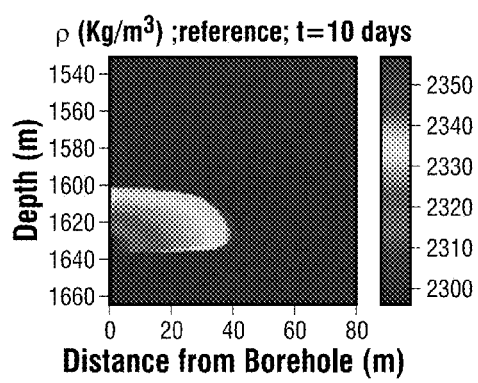
Figure 21F:
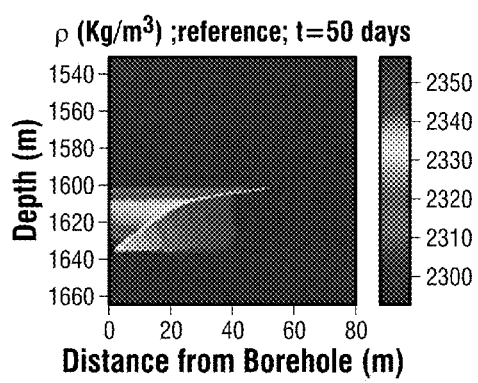
Figure 22A:
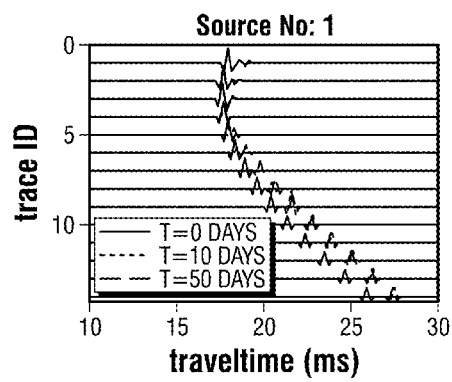
Figure 22B:
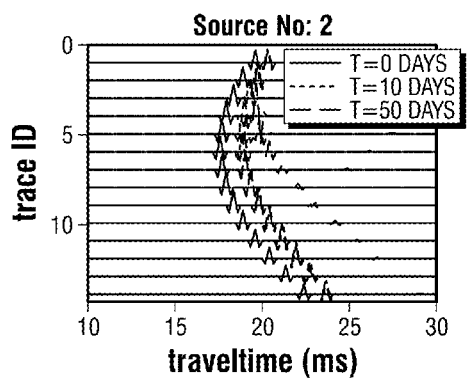
Figure 22C:
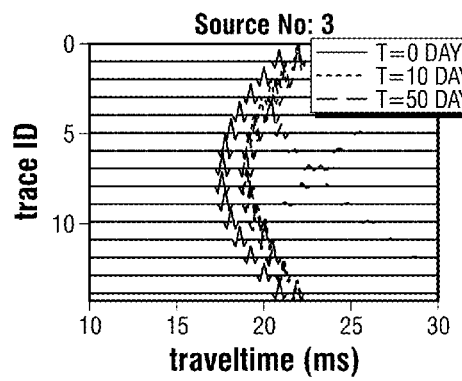
Figure 22D:
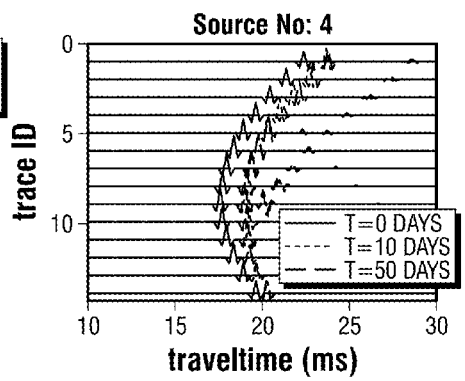
Figure 22E:
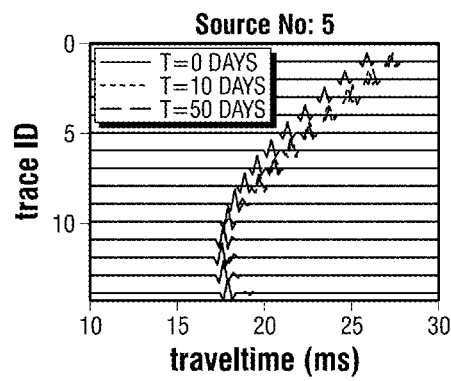
Figure 23A:
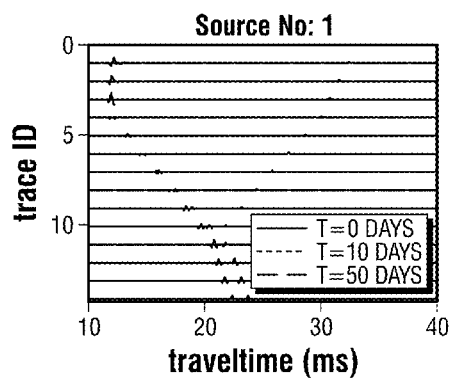
Figure 23B:
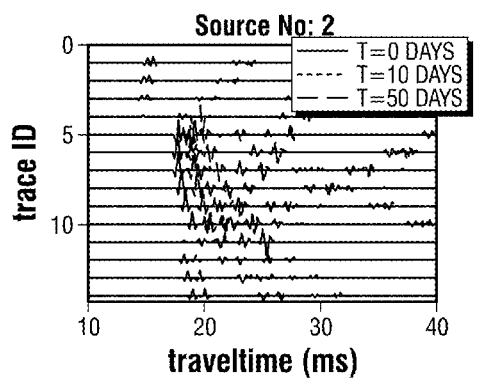
Figure 23C:
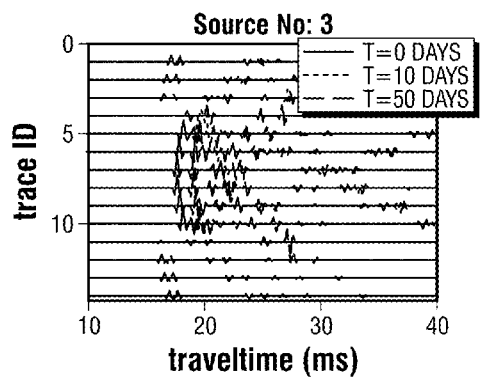
Figure 23D:
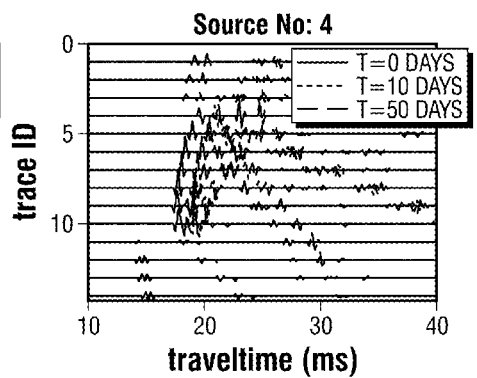
Figure 23E:
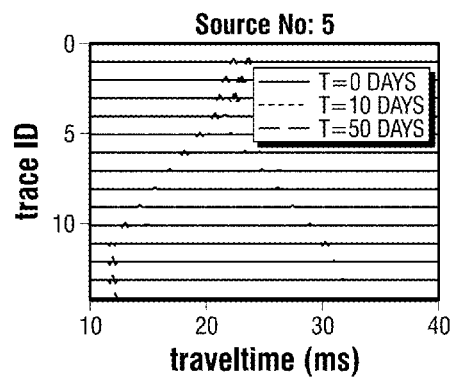

FIGS. 20A-20C show Vp, Vs and density profiles at t=0, for the reference models. Here, overburden and underburden are considered to have the same seismic properties as the reservoir, before injection. The small changes in seismic properties within the reservoir are due to the pressure gradient. Sources (asterisks) and receivers (triangles) are also shown in the figure.

FIGS. 21A-21F show Acoustic and density profiles in the reservoir, for the reference model, in 10 and 50 days.

FIGS. 22A-22E show seismograms for all source-receiver combinations, for the reference model (homogeneous case). Slowness change due to the presence of $CO_2$ in the formation is significant and is evident in the delay of arrival times when compared to initial time.

FIGS. 23A-23E demonstrate seismograms for all source-receiver combination, for the reference model (layered case). We can see that there is significant change in the arrival time of the reflection due to $CO_2$ injection.

DETAILED DESCRIPTION

Embodiments relate to a new method for obtaining accurate spatial distribution of $CO_2$ from crosswell seismic measurements. The method involves integration of the fluid flow and full waveform models together with the fluid substitution model in a cross-well environment for the simulation of the changes in the acoustic properties of a fluid-filled porous rock due to $CO_2$ flow. Control parameters for the integrated model are independent petrophysical properties of the formation considered for $CO_2$ storage. The input reservoir parameters are horizontal and vertical permeabilities ($k_v$ and $k_h$), residual wetting and nonwetting phase saturations ($S_{wr}$ and $S_{rCO2}$ or $S_{orm}$) and entry capillary pressure constant ($j_b$). In particular, the parameter $j_b$ and formation permeabilities (usually the horizontal permeability or an appropriately scaled permeability that accounts for microscopic layering) together define the entry capillary pressure, $$P_b = j_b \gamma \sqrt{\frac{\phi}{k}},$$

that is necessary in turn used to set the capillary pressure, $P_c = S^{-1/\lambda} P_b$. Here, $\gamma$ is the interfacial surface tension, S is a normalized fluid saturation and $\lambda$ is the pore size distribution number. Similarly, $S_{wr}$ and $S_{rCO2}$ defines the end points and the shape of the saturation-dependent relative permeability curves (for wetting phase defined by $k_{rw}$ and non-wetting phase defined by $k_{rn}$) which are the key components of multiphase flow. With the relative permeability curves, superficial Darcy velocities for each phase are given by $$v_\beta = -\frac{k k_{r\beta}}{\mu_\beta}(\nabla P_\beta - g \rho_\beta)$$

where $\mu_\beta$, $P_\beta$, $\rho_\beta$ represent the corresponding shear coefficient of viscosity, pressure, density for each phase and g is the acceleration due to gravity. Once the geometrical properties of the reservoir are fixed, these parameters dictate the flow in porous media and the shape of the saturation profiles of the fluids. Thus, measurement obtained during or post $CO_2$ injections are implicitly defined by these parameters. For example, if the horizontal layer permeability is perturbed a little, fluid front will be distorted and pore pressure will change. Consequently, this will change the acoustic properties of the fluid bearing rock because of the changes in the pressure, temperature and bulk density due to the presence of $CO_2$ in the pore. If the true values of the petrophysical and rock properties of the formation are known, simulation of flow and their corresponding tool responses will generate data comparable to actual physical measurements provided that the mathematical models and their numerical solutions are reasonably accurate.

Full waveform inversions are commonly employed for hydrocarbon exploration and reservoir characterization. Full waveform inversion of seismic data is also proposed for monitoring $CO_2$ plume regularly both in frequency and time domain. Other methods propose to monitor $CO_2$ in the subsurface by looking at the difference in velocity profiles from baseline. These predicted velocities are obtained from the inversion of seismic data without due consideration of fluid properties and their changes dictated by the alteration in the state of the reservoir. Some research does indicate the integration of reservoir model with the seismic model but these inventions focus on the use of seismic measurements for the initial reservoir model building and possible inversion of the formation porosity and saturation without thermodynamic consistency and parameter independence. More importantly, some methods perform full waveform inversions of seismic data using voxel based approach. Voxel based inversion technique is known to be computationally expensive and shows non-unique characteristics that result with uncertain predictions. Extracting the fluid properties from these predicted velocities through the inversion of seismic data is fruitless. In the best case scenarios, a predicted velocity profile only indicate the location of $CO_2$ in subsurface and it can not reveal any fluid properties such as saturation, density etc.

Embodiments relate to a method for obtaining the spatial distribution of $CO_2$ saturation in the porous media. The technique involves identifying key independent petrophysical parameters with which a reservoir model can be created bottom-up in physically consistent manner. Petrophysical parameters of interest dictate the flow in porous media. Small changes in one or more of these parameters will be reflected as changes on the fluid flow pattern in the porous media. In turn, the changes in the flow pattern will result with different tool response.

Embodiments relate to a model based method to invert for the petrophysical parameters, which from now on will be referred as "Input Parameters", from crosswell seismic measurements so that at every step physical consistency among the mathematical models is honored. Once the petrophysical input parameters are identified, a reservoir plus thermodynamic plus effective velocity plus seismic models can be used together for determining $CO_2$ profile underground and making prediction of $CO_2$ plume in the reservoir at a time in the future along with seismic responses.

Accurate predictions of storage capacity and spatial distribution of injected $CO_2$ in the underground have value to underground $CO_2$ storage in minimizing the cost of operation and reducing the risk of impermanence of $CO_2$ in the reservoir. For example, information on the spatial distribution of $CO_2$ plume in the ground does have implications in terms of storage efficiency and capacity and, more importantly, on the containment of $CO_2$ underground permanently. The predictions on the fate of $CO_2$ underground in the future are made based on the interpretation of measurements combined with mathematical modeling and simulations. Thus, the conformity of simulated results to actual physical phenomena is crucial for a good decision. Reliability of prediction depends on several factors: sufficient measurements, mathematical models which are physically consistent with the actual problem and, of course, the accuracy of the numerical solutions of the mathematical models.

Embodiments also relate to a method for obtaining accurate spatial distribution of $CO_2$ from crosswell seismic measurements. The method involves integration of the fluid flow and full waveform models together with the thermodynamic and fluid substitution models in a crosswell environment for the simulation of the changes in the acoustic properties of the porous rock due to $CO_2$ injection. Control parameters for the integrated model are the independent petrophysical properties or input parameters of the formation considered for $CO_2$ storage. The input reservoir parameters are horizontal and vertical permeabilities ($k_v$ and $k_h$), residual wetting and nonwetting phase saturations ($S_{wr}$ and $S_{rCO2}$ or $S_{orm}$) and entry capillary pressure constant ($j_b$). Once the geometrical properties of the reservoir are fixed, these parameters dictate the flow in porous media and the shape of the fluid/gas fronts. Thus, measurement carried during or post $CO_2$ injections are implicitly defined by these parameters. For example, if the horizontal layer permeability is perturbed a little, fluid profile will be distorted and pore pressure will change. This will in turn change the acoustic properties of the fluid bearing rock because of the changes in the pressure, temperature and bulk density due to the presence of $CO_2$ in the pore. If the true values of the petrophysical and rock properties of the formation are known, simulation of flow and their corresponding tool responses will generate data comparable to actual physical measurements provided that the mathematical models and their numerical solutions are reasonably accurate.

The reservoir input parameters (petrophysical parameters) can be obtained from the inversion of crosswell seismic measurements and/or wellbore measurements such as pressure, temperature, and near wellbore saturation data. Let's start with the description of the geological models. It is assumed that saline aquifer is overlain by an impermeable caprock that confines the injected. $CO_2$ in the aquifer. Though the caprock is impermeable to fluid flow, seismic waves do pass through this layer. Therefore we consider a saline aquifer that is embedded in a larger reservoir model for wave propagation. Thus, the formation where $CO_2$ is injected is shared by the flow and seismic models. Same grids shall be used for the numerical solutions of flow and seismic model in this region as much as possible. Otherwise the simulated flow properties need to be interpolated for the compatibility of each model.

Figure 12:
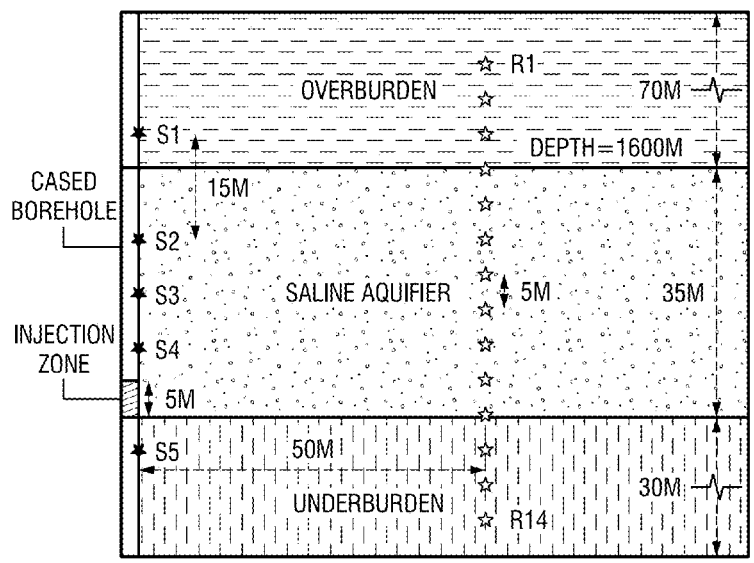
FIG. 12 is a schematic diagram of the geologic model. The red stars in the above figure (S1 to S5) represent the source locations for seismic simulations and the green stars (R1 to R14) represent the receiver locations.
Figure 13:
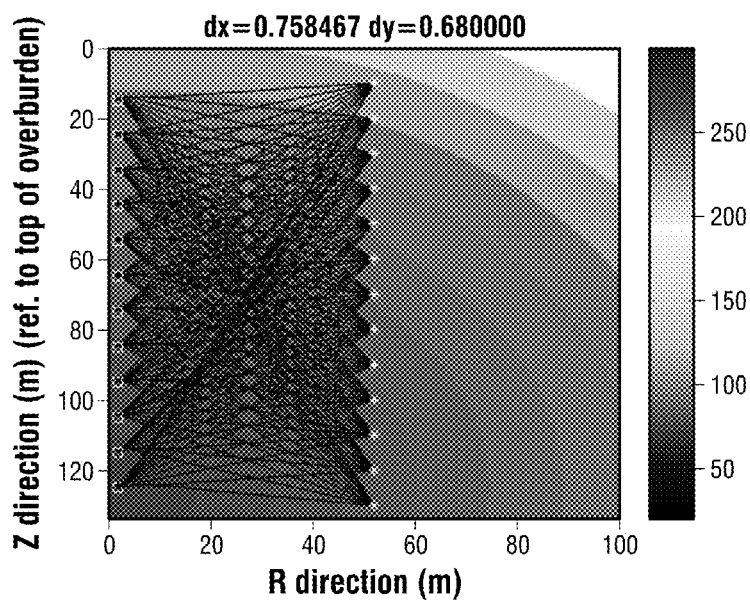
FIG. 13 shows ray coverage for the direct arrivals.
Figure 14:
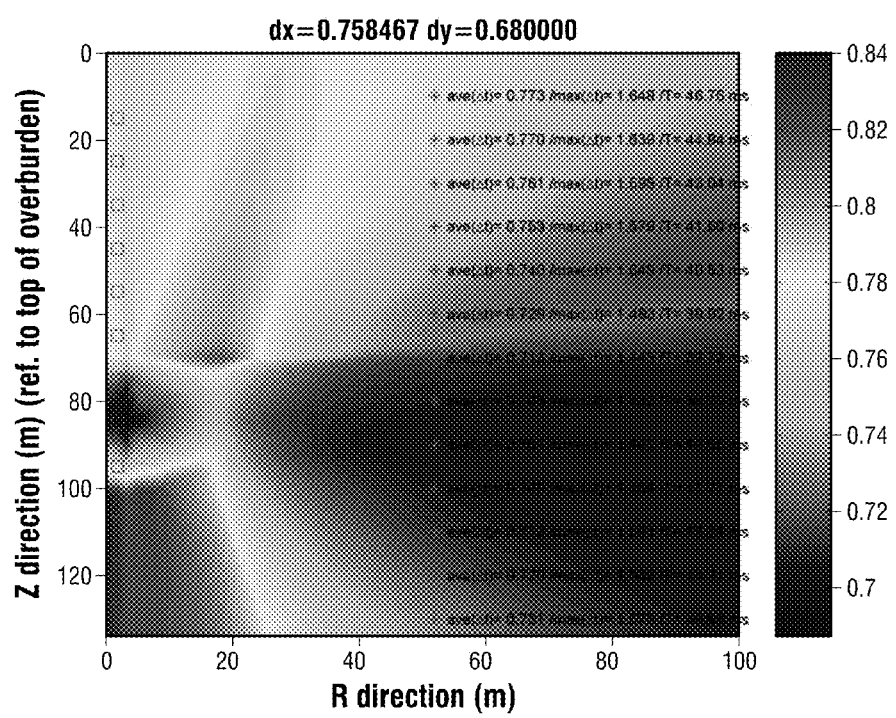
FIG. 14 is the difference in travel times between pre- and post-$CO_2$ injection using reference input parameters.
Figure 15:
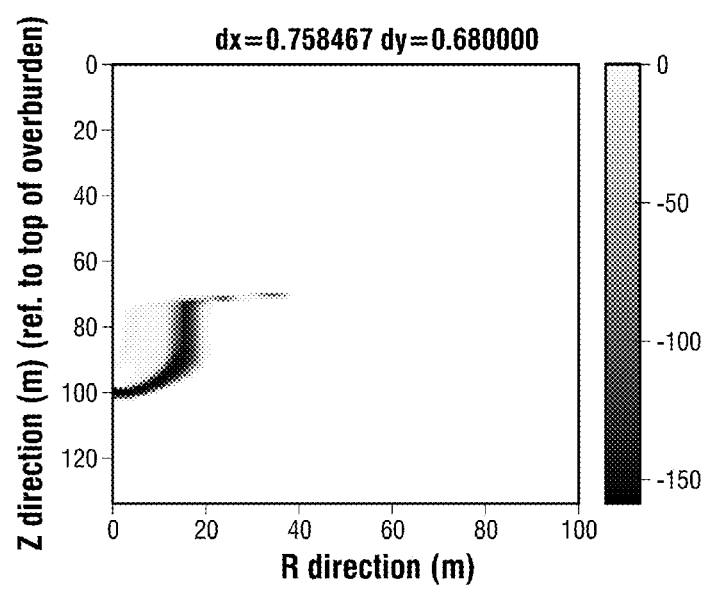
FIG. 15 is velocity difference from the reference state when the horizontal permeability is changed 400 mD.
Figure 16:
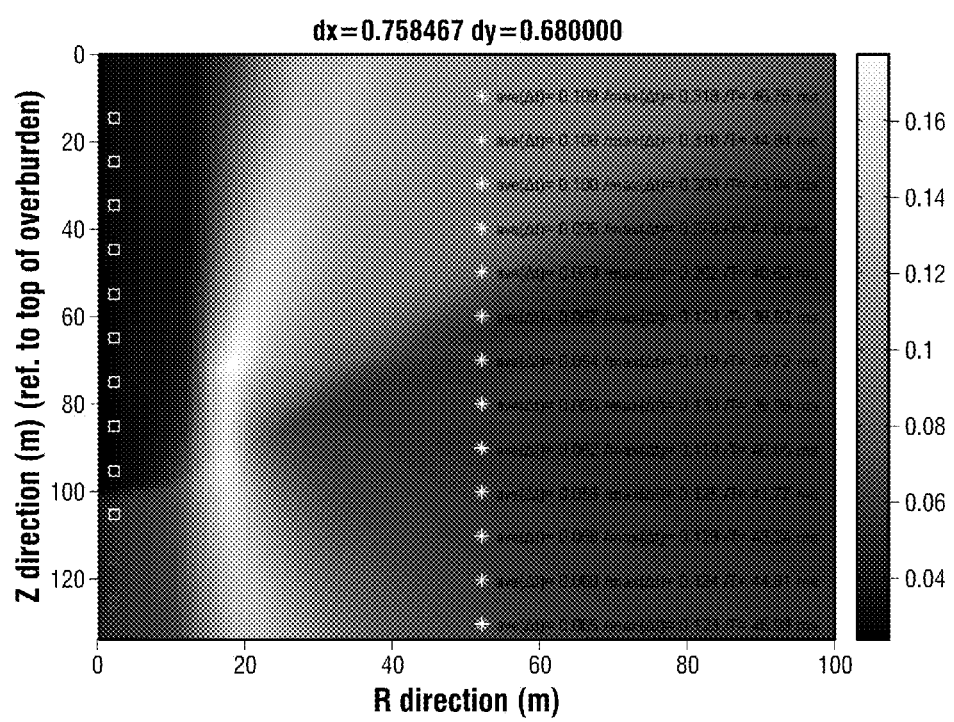
FIG. 16 is travel time difference from the reference state when the horizontal permeability is changed 400 mD.

In order to simulate the flow in porous media accurately, it is necessary to resolve the heterogeneity in the reservoir. However, heterogeneity in the reservoir may exist at multiple length scales. This is physically impossible to consider because of computational and descriptive limitations. Upscaling techniques are necessary to resolve even the macroscopic measurable fluctuations. We upscale the formation properties appropriately within the geological layer boundaries, within variations are nearly random and are limited in magnitude. For this, we use the well logs (such as inferred porosity, permeability etc.) from the target wells and the surrounding nearby wells to identify possible geological layers boundaries at the wellbores. Next, inter-well horizontal layer boundaries and vertical compartments are defined by correlating the corresponding layer boundaries from each well together with the available seismic surveys from the area or regional geological maps. Reservoir fluid and rock properties (bulk and shear modulus, rock density, porosity) within each layer are averaged out and each geological layer is assigned uniform properties. Some of these are elements of the input parameter set. For simplicity, let us denote the input parameters for the $k^{th}$ layer by $x_k=(S_{wr}, S_{rCO2}, j_b, k_v, k_h)$ and set $x=(x_1, x_2, x_3, \ldots, x_n)$. This means that numerical grids in the kth layer would all have the same $x_k$. A schematic of reservoir model in (r,z)-plane is given in FIG. 12.

We overlay sufficient number of numerical grids at each layer that would honor the physical constraints (e.g. five or more grids per seismic wave length) and also have sufficiently small grid lengths for numerical accuracy. Upon determining average rock and fluid properties, we perform a grid convergence test to optimize the grids in the flow simulation so that computational memory is made affordable without sacrificing the numerical accuracy.

Phase pressures in each numerical grid are initialized using the reservoir temperature, distance from the surface and free water level as well as the initial "input parameters" for the layer corresponding to the grid. Similarly we assign relative permeability curves for each grid that are generated using the input parameters and correlations specific to the material type of the rock. Upon obtaining the initial capillary pressures at each grid from the phase pressure, we utilize the x to calculate initial saturation profiles (brine and $CO_2$) from the capillary pressure. Similarly, seismic properties of the reservoir such as effective bulk modulus, shear modulus and bulk density in each numerical grid are initialized using a fluid substitution model for $CO_2$ and brine. At this point, we have the necessary input properties to simulate wave propagation according to the source and receiver sets provided, and obtain the initial synthetic seismograms. Notice the systematic construction of seismograms starting from the initial "input parameters". Synthetic seismograms at t=0 can be used to obtain the initial formation porosities and permeabilities from the inversion of baseline cross well seismic measurements.

Figure 17:
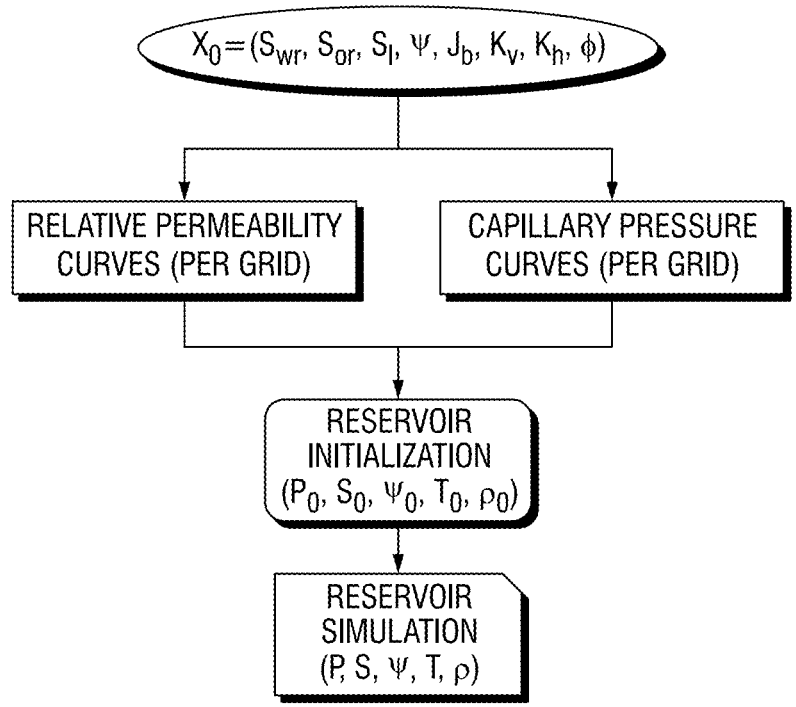
FIG. 17 is a schematic for reservoir simulations.
Figure 18:
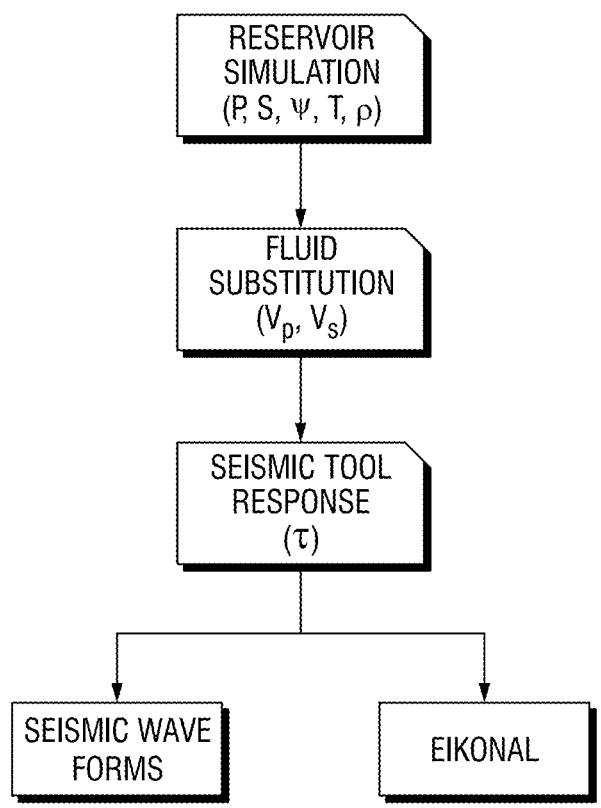
FIG. 18 is a flow chart including integration of full waveform model and Eikonal solver with a reservoir model.

Using the initial reservoir properties (initial pressure and saturation profiles) and the "input parameters" for each layer, a reservoir simulator can be used to simulate $CO_2$ injection into the saline aquifer over a time step $t^*=\Delta t$, and obtain new pressure, saturation and density profiles at $t^*$. A schematic diagram of starting from an x and obtaining phase pressures and saturations are given in FIG. 17. Next, saturation and pressure profiles at $t^*$ are fed to the fluid substitution model to update the effective bulk density and velocities values at each grid. Upon updating the acoustic properties of the rock at each grid, we can simulate the wave propagation across the wells and collect the synthetic seismograms, $d_s(x)$, at the receivers for the time $t^*$. A diagram is given to show the steps of obtaining seismograms or 1st arrivals starting from the phase pressure and saturation profile level in FIG. 18.

If x is a true representation of the formation's layer properties, and mathematical models and their numerical solutions are accurate, difference in the synthetic and observed data, e.g. $|d_0\ d_s|^2$, will be sufficiently close to zero. If not, then we search a new x until $$\min_x \|d_0\ d_s(x)\|_n \approx 0 \text{ at } x$$

where n is an integer usually chosen to be two. Please see the diagram in FIG. 8 that illustrates minimization. At the end of the optimization, we find an x, which when substituted in the reservoir simulation, returns synthetic cross-well data at time $t^*$ that is sufficiently close to the observed data. Thus, using x obtained from the inversion of the observed data, reservoir simulator can be used to simulate $CO_2$ injection into saline aquifer beyond the time $t^*$ and quantify $CO_2$ saturation profiles in the reservoir.

Figure 1A:
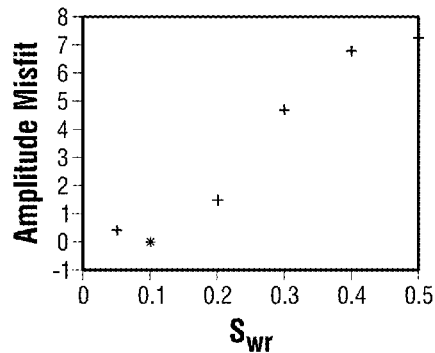
Figure 1B:
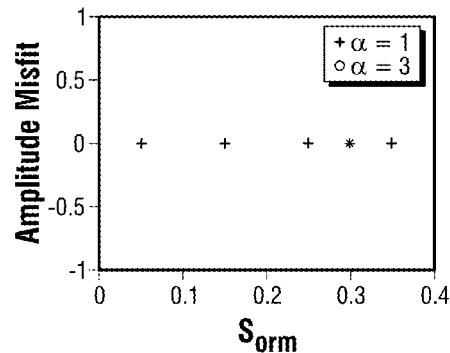
Figure 1C:
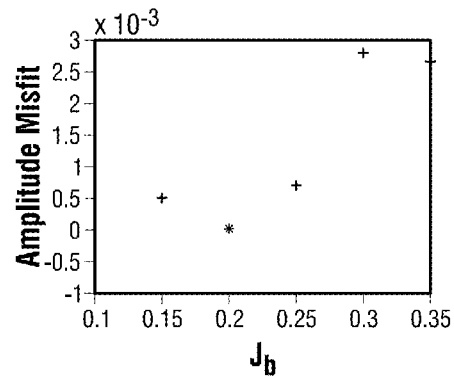
Figure 1D:
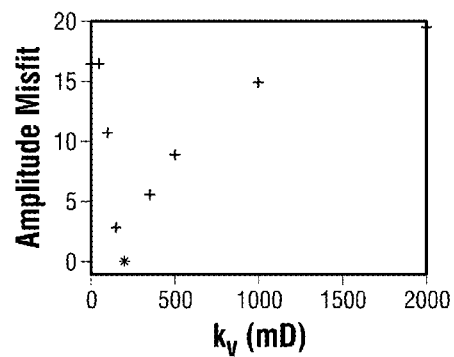
Figure 1E:
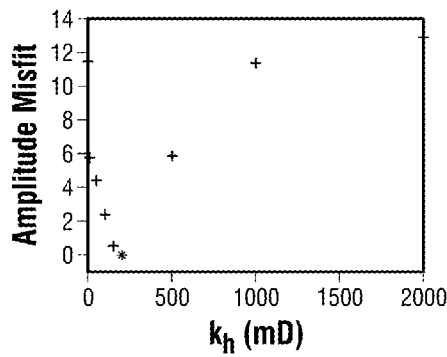
Figure 1F:
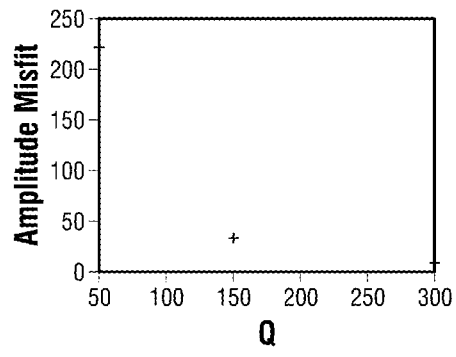
Figure 2A:
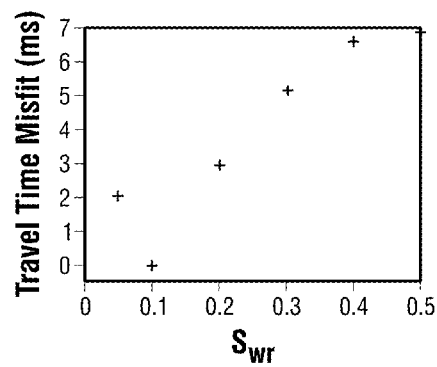
Figure 2B:
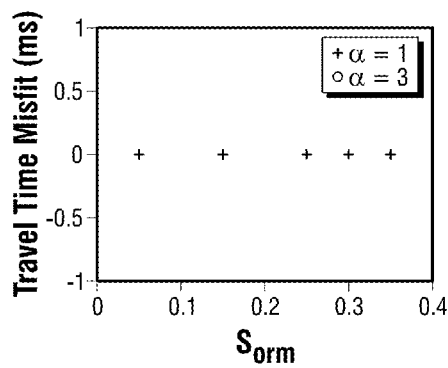
Figure 2C:
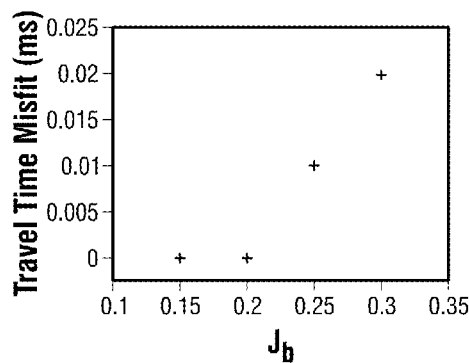
Figure 2D:
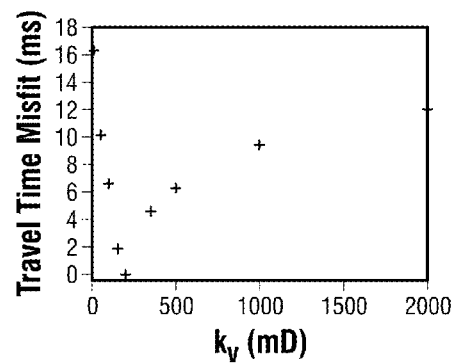
Figure 2E:
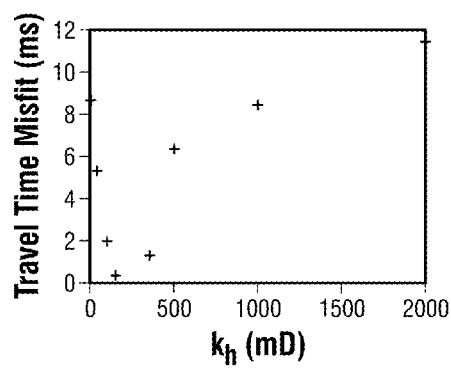
Figure 2F:
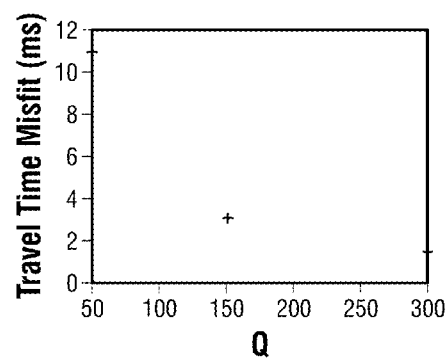
Figure 3A:
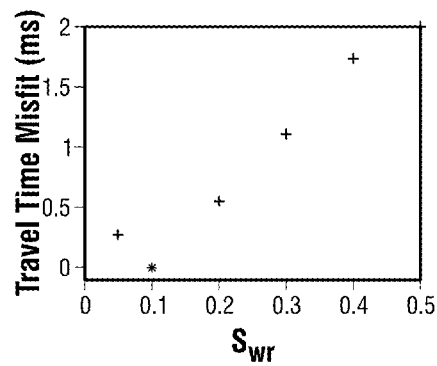
Figure 3B:
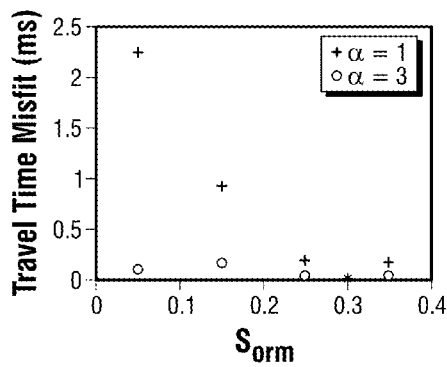
Figure 3C:
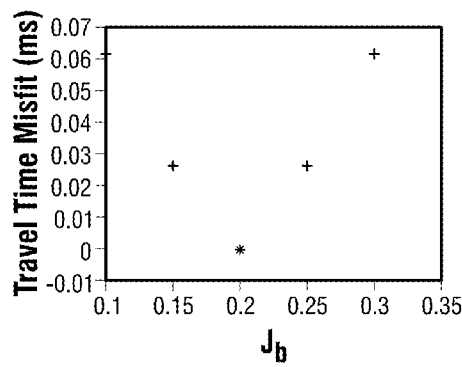
Figure 3D:
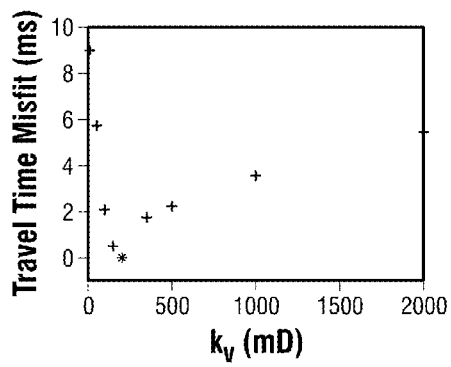
Figure 3E:
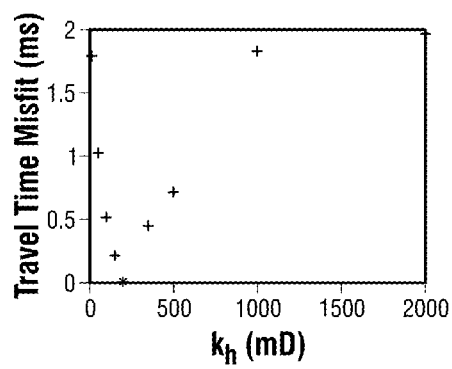
Figure 3F:
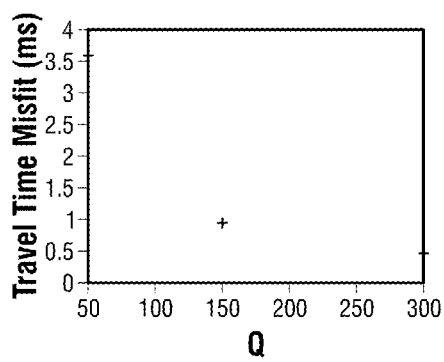
Figure 4A:
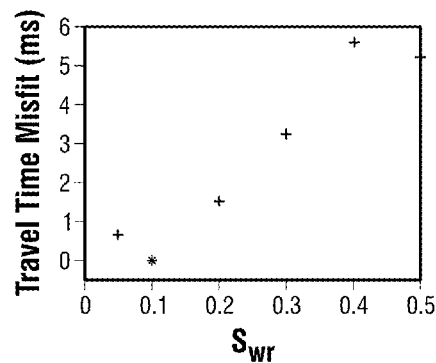
Figure 4B:
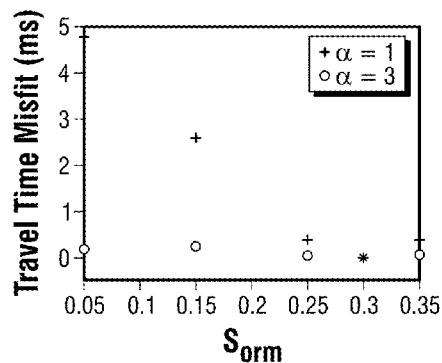
Figure 4C:
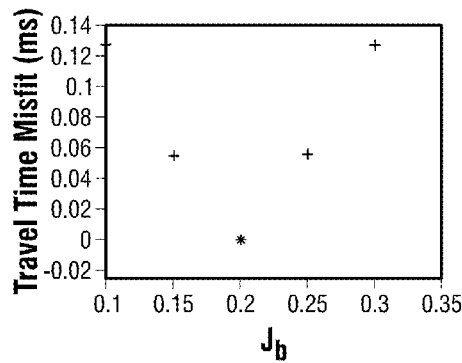
Figure 4D:
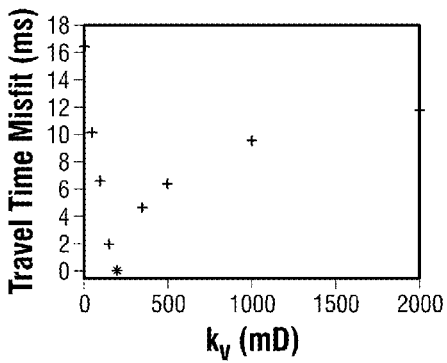
Figure 4E:
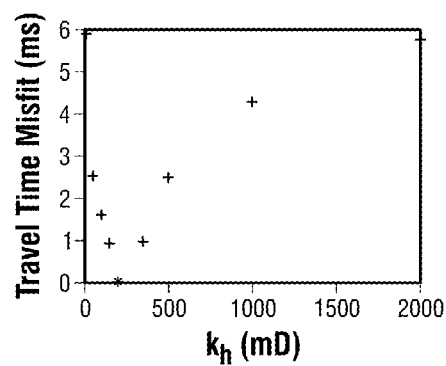
Figure 4F:
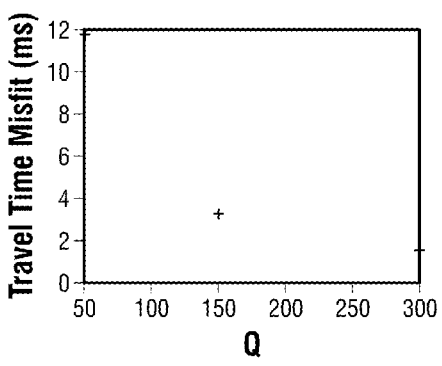
Figure 5A:
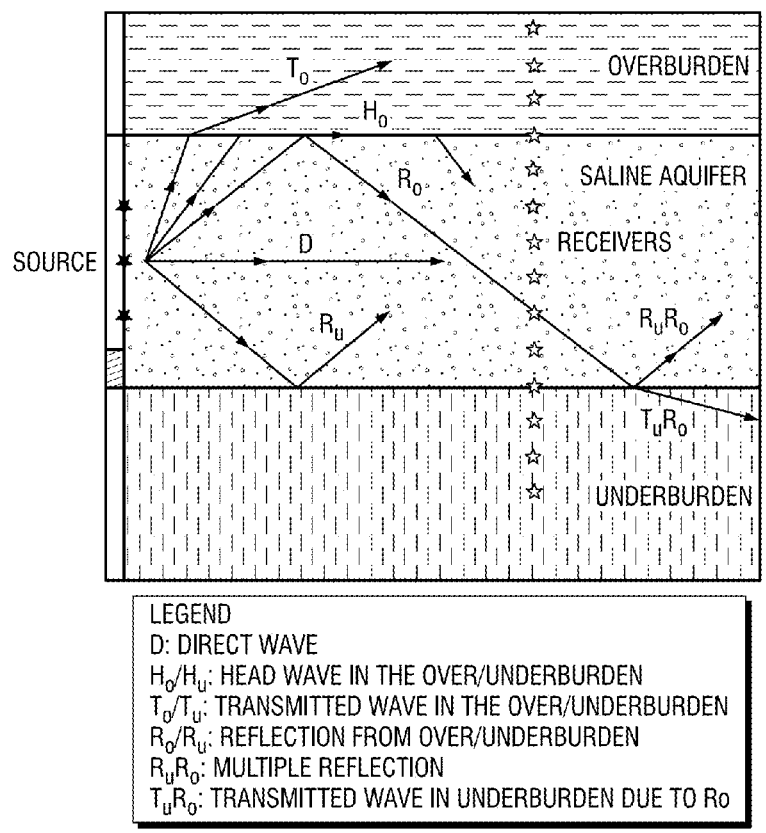
Figure 5B:
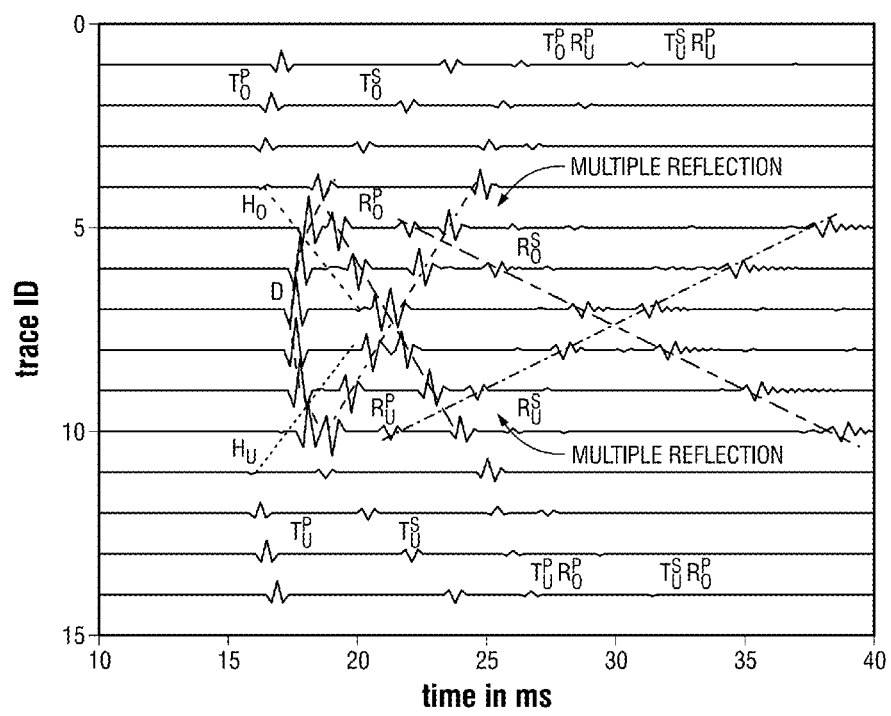
Figure 6A:
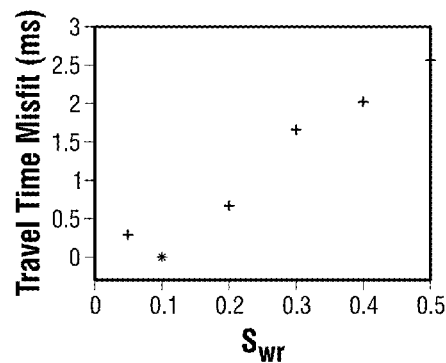
Figure 6B:
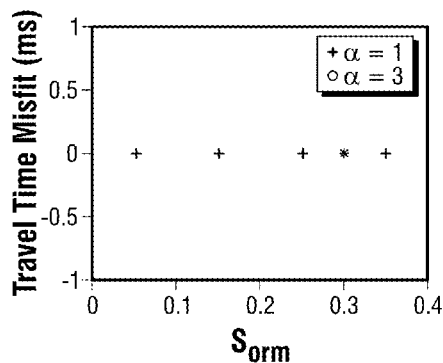
Figure 6C:
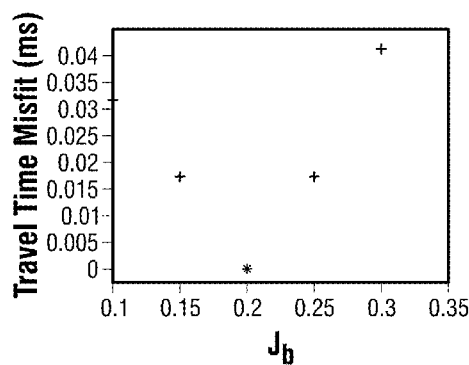
Figure 6D:
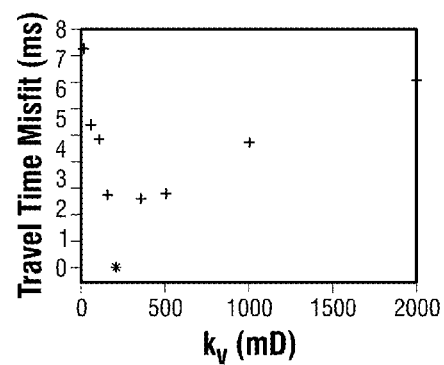
Figure 6E:
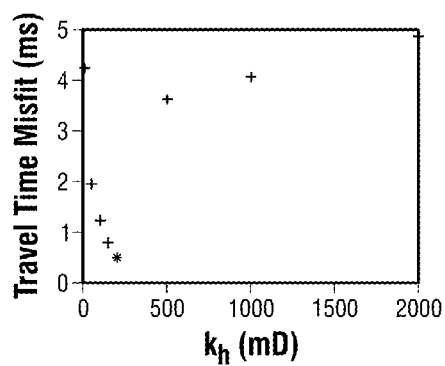
Figure 6F:
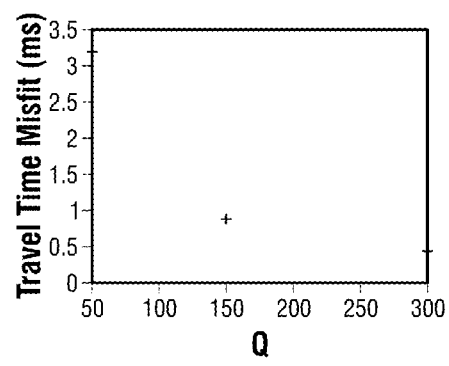
Figure 7A:
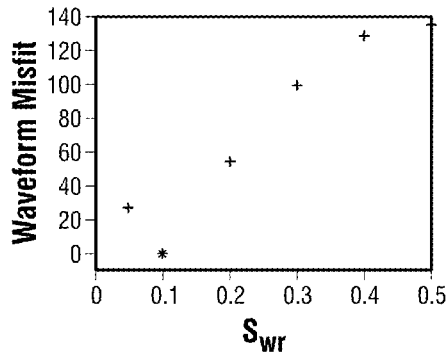
Figure 7B:
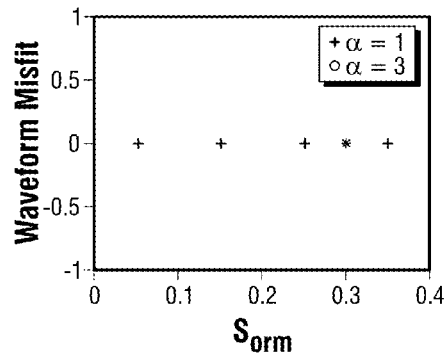
Figure 7C:
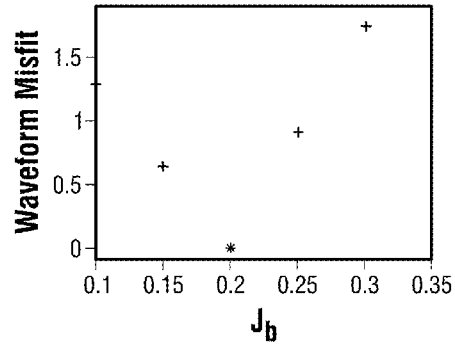
Figure 7D:
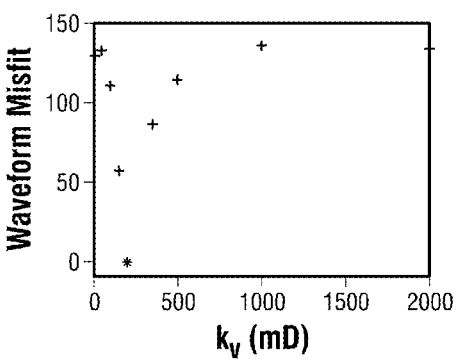
Figure 7E:
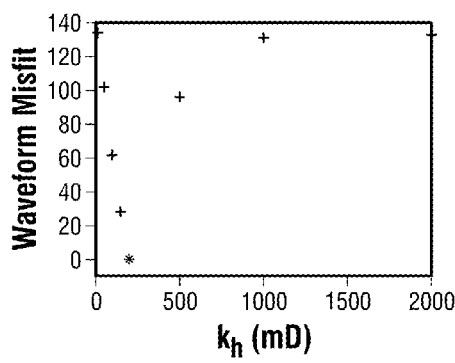
Figure 7F:
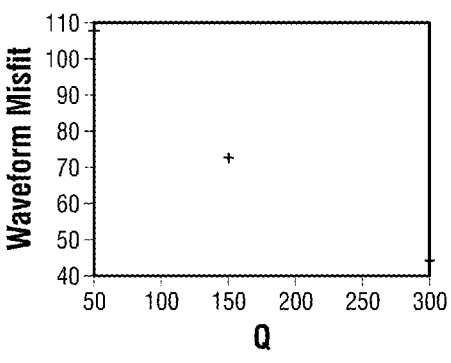
Figure 8:
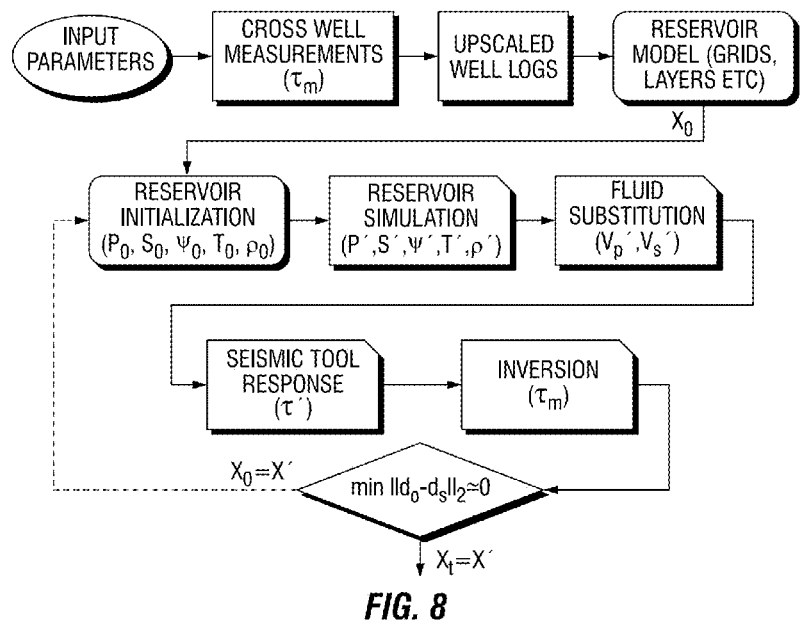
FIG. 8 is a diagram of inversion of cross-well seismic data for petrophysical parameters.
Figure 9:
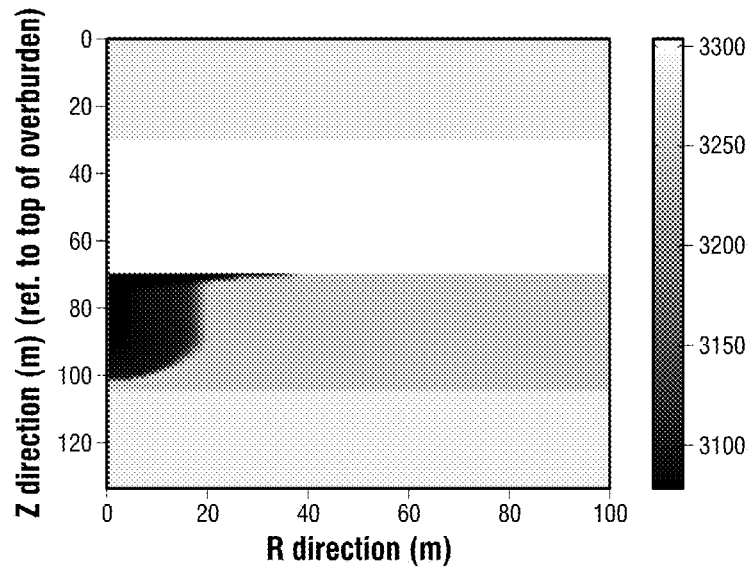
FIG. 9 illustrates compressional velocity profile in (r,z)-plane corresponding to reservoir pressure, saturation and temperature profiles obtain from the reservoir simulator during $CO_2$ injection.
Figure 10:
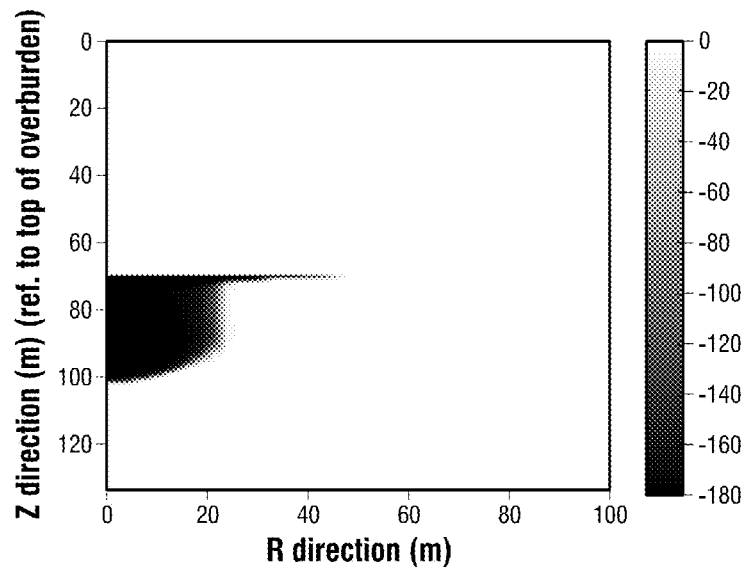
FIG. 10 shows the difference in compressional velocity profile from baseline using the reference input parameters.
Figure 11:
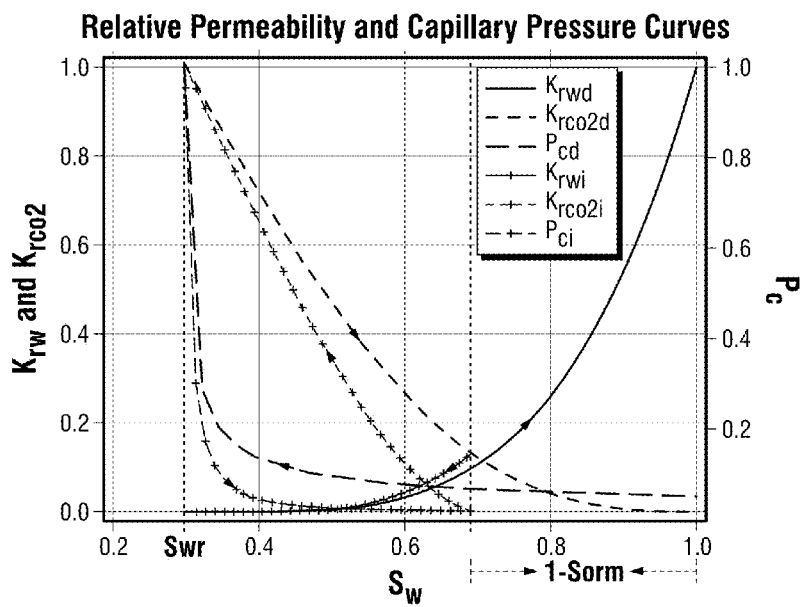
FIG. 11 is a representative relative permeability and capillary pressure curves.
Figure 19:
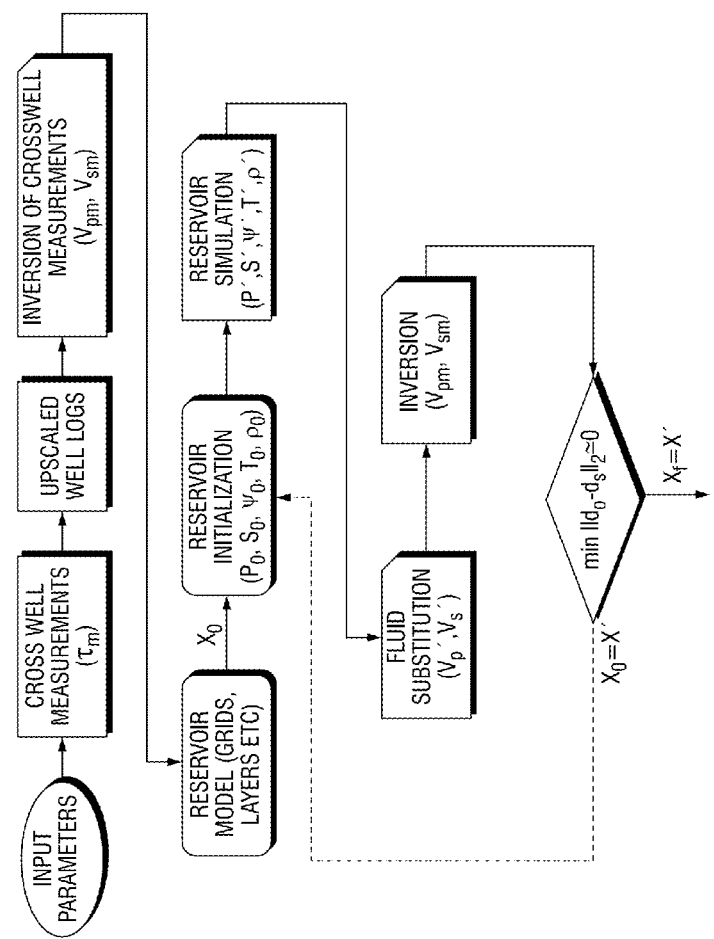
FIG. 19 is a flow chart for obtaining petrophysical parameters from velocity profile.

In other applications, algorithm in FIG. 8 can be modified to obtain x from the inversion of the compressional and shear velocities as shown in FIG. 19. This approach relies on accurate full waveform inversion of observed seismic data.

An inversion code employs the integrated flow and waveform model as a forward tool for the inversion of the crosswell seismic measurements, and obtains the necessary upscaled petrophysical parameters that are accurate representation of the reservoir heterogeneity. A reservoir model can be built in physically consistent manner based on these parameters. Because the reservoir model is built bottom up using fundamental reservoir parameters, reservoir simulations can be carried on this model for determining $CO_2$ plume in the reservoir and quantify $CO_2$ properties.

Some embodiments may benefit from using crosswell seismic data for quantifying $CO_2$ in subsurface injected for the purpose of reducing $CO_2$ emission. This technique involves the inversion of the key reservoir parameters for each geological layer, such as $S_{wr}, S_{rCO2}, j_b, k_v$ and $k_h$. Petrophysical parameters are the back-bone of any multiphase flow reservoir models. These parameters are used in the generation of relative permeability and capillary pressure curves, and enable multiphase flow simulation. They dictate the direction of the flow in porous media and are the key factors in time evolution of each fluid/gas phases in subsurface (see for representative relative permeability and capillary pressure curves). Any change in these parameters would be reflected in the eventual reservoir state: saturation, pressure, temperature, and thus, bulk density, shear and bulk moduli. Acoustic measurements are in turn affected by these quantities and therefore, crosswell seismic measurements are ultimately affected by the characterization of multiphase flow. If the changes in the seismic measurements due to the perturbations in the input parameters are measurable quantity, then the input parameters can be obtained from the inversion of cross-well seismic measurements combined with well-logs and reservoir simulation.

Inversion of the petrophysical parameters from cross-well seismic data would be possible only if seismic data shows sufficient sensitivity to these parameters. In order to test the sensitivity of seismic measurements to petrophysical parameters, one needs to simulate systematically the $CO_2$ injection into the reservoir to calculate the corresponding reservoir pressure, temperature and saturations profiles. Effective velocities of the fluid bearing formation need to be updated for the pressure, temperature and saturation profiles obtained from the reservoir simulator. Next, these effective velocity profiles are used to generate synthetic seismic data via seismic models (Eikonal or full waveform) as shown in. A reference geological model will be used throughout the study to generate synthetic pressure, saturation and temperature profiles, and thus, generate synthetic seismic data for any set of petrophysical parameters. $CO_2$ injection and monitoring are simulated using a standalone multiphase flow model, and effective velocities are updated according to the reservoir pressure, temperature and saturation profiles obtained from the simulator by a fluid substitution model such as Gassmann and thermodynamic models for fluid moduli. Next, the velocity profile is used to generate synthetic seismic data in crosswell environment using an Eikonal solver or a full waveform model.

We performed two separate studies to test the sensitivity to petrophysical parameters, one with direct arrivals and the other with full waveforms but we use the same geological model and a similar approach to check the sensitivity: generating a reference synthetic seismic data based on a reference set of parameters and calculating the misfit between this reference data and the synthetic seismic data obtain by varying the input parameters. Though the geological model is the same in these approaches, acoustic source and receiver locations and total injected $CO_2$ are different.

Sensitivity Based on Direct Arrival Times

In order to generate synthetic direct arrivals corresponding to effective velocity profiles, we carry out ray-tracing using an Eikonal solver or a ray tracing tool, and look at the slowness in the arrival times of the P-waves.

To test the sensitivity of the first arrivals to the input parameters, a reservoir model is built under the following assumptions; Formation is homogeneous (constant $S_{wr}$, $S_{rCO2}$, $j_b$, $k_v$, $\emptyset$ and $k_h$ within the aquifer). Injection zone is formed of sandstone with bulk and shear moduli of 20 MPa and rock density of $\rho_r=2.5$ g/cc. The reservoir is at a depth of 1600 m and it is 35 m thick. The pressure at the datum depth is 16 MPa and the reservoir temperature is 45° C. Porosity of the aquifer is 0.2. $CO_2$ is injected into the aquifer for one day at a rate 25 sm$^3$/s between the interval of 1620 m and 1625 in and monitored for 100 days. Reservoir contains two overburden layers and one underburden, which are 70 m and 30 m in thickness (bulk modulus K=20 GPa, G=20 GPa, $\rho_o=0.2$ g/cc and $\rho_u=2.5$ g/cc respectively; In this case, the velocity contrast between the reservoir section and the caprock is low and headwaves are generally avoided. Twelve seismic sources are placed in the wellbore with 10 m interval; thirteen receivers are located 50 m away from the wellbore with a vertical interval of 10 m unless otherwise specified. A representation of the reservoir model along with ray coverage is given in and.

To quantify the sensitivity between the receiver, i, and the source, j, for a parameter $x \in \{x:x=(k_v,k_h,S_{wr},S_{rCO2},j_b)\}$, following metric is used:

$$S_{ij}(x;x_0)=T_{ij}(x;x_0)-T^0_{ij}(x;x_0)$$

where x is the input parameter to be compared, and $x_0$ is the reference parameter. $T_{ij}$ is the travel time corresponding to x, and $T^0_{ij}$ is the travel time corresponding to the reference, $x_0$. To simplify the quantification, RMS sensitivity $S_i$, an averaged travel-time difference $\Delta t$ is defined as $$ave(\Delta t) \equiv S_i = \sqrt{\frac{\sum_{j=1}^{N_s} S_{ij}^2}{N_s}}$$

where $N_s$ is the number of sources. Here $S_i$ characterizes the average sensitivity at a receiver, j, for all sources defined by $$S_i = \sqrt{\frac{\sum_{j=1}^{N_s} S_{ij}^2}{N_s}}$$

where $N_s$ is the number of sources. Also, maximum sensitivity can be defined as $$\max(\Delta t)=\max(|S_{ij}|)$$

In comparison, we also calculate a RMS travel time at a receiver as $$T_i = \sqrt{\sum_{j=1}^{N_s} \frac{T_{ij}^2}{N}}$$

To investigate the sensitivity of the first arrivals of the seismic waves to each input parameter, a reference reservoir with the following input properties are chosen: residual water saturation ($S_{wr}$) of 0.1, residual $CO_2$ saturation ($S_{rCO2}$) of 0.3, a ($j_b$) of 0.2, vertical permeability ($k_v$) of 200 mD and horizontal permeability ($k_h$) of 200 mD. Each parameter is perturbed in a reasonable range, and travel-time perturbations at various receivers are computed.

By comparing the travel-time with different parameter values, one can qualitatively and quantitatively acquire the first-arrival sensitivity of each parameter. First-arrival times are calculated by an Eikonal solver to trace the formation with rays across the wells during and post-$CO_2$ injection. Eikonal solvers or other ray tracing methods are suitable for the simulation of the wave-front in high frequency cross-well seismic measurements. In, we show the compressional velocity profile in (r,z)-plane corresponding to reservoir pressure, saturation and temperature profiles obtain from the reservoir simulator during $CO_2$ injection. The difference in effective velocity profiles pre- and post-CO2 injections are shown in. The corresponding difference in the first arrival times between the pre- and post-$CO_2$ injection in terms of travel-time can be seen in. The average travel-time deviation in this case is quite large (ave($\Delta t$)$\approx$0.7 ms) and the maximum deviation is about max($\Delta t$)=1.5 ms. Large deviation means that monitoring $CO_2$ (presence and location) is quite possible via cross-well seismic inversion based on direct arrivals.

Next, we examined the sensitivity to petrophysical parameters by varying the input parameters and generating the corresponding synthetic first arrival seismic data. The corresponding difference in compressional velocity and first arrival times between the reference case with $x_r=(S_{wr},S_{rCO2},j_b,k_v,k_h)=(0.1, 0.3, 0.2, 200$ mD, $200$ mD) and with x=(0.1, 0.3, 0.2, 200 mD, 400 mD), a 200 mD increase in horizontal permeability, are given in and. In the case of sensitivity to $k_h$, we see a max ($\Delta t$) as high as 0.318 ms, a significant change in arrival time which qualifies $k_h$ for inversion from cross-well seismic based on first arrivals. Deviation from the reference case in first arrivals times are reported in. In this case, except $j_b$, difference in first arrival times are larger than a threshold value (0.03 ms) for high frequency (3 kHz) and therefore the petrophysical parameters can be inverted from first arrival times obtain in cross-well geometry.

TABLE 1

Travel-time difference in millisecond (ms) from the reference state for various petrophysical data (10 days CO2 injection and monitoring in 100 days)

| $k_v$(mD) | max($\Delta t$) | $k_h$(mD) | max($\Delta t$) | $S_{wr}$ | max($\Delta t$) | $S_{rCO2}$ | max($\Delta t$) | $j_b$ | max($\Delta t$) |
|---|---|---|---|---|---|---|---|---|---|
| 50 | 0.408 | 50 | 0.082 | 0.3 | 0.084 | 0.1 | 0.343 | 0.1 | 0.015 |
|  |  | 400 | 0.318 | 0.3 | 0.157 | 0.2 | 0.118 | 0.3 | 0.013 |

TABLE 1-continued

Travel-time difference in millisecond (ms) from the reference state for various petrophysical data (10 days CO2 injection and monitoring in 100 days)

| $k_v$(mD) | max(Δt) | $k_h$(mD) | max(Δt) | $S_{wr}$ | max(Δt) | $S_{rCO2}$ | max(Δt) | $j_b$ | max(Δt) |
|---|---|---|---|---|---|---|---|---|---|
| 1000 | 1.11 | 1000 | 1.111 | | | | | | |
| 4000 | 1.187 | 4000 | 1.617 | | | | | | |

If we inject more $CO_2$ (injecting 100 days) into the formation, maximum slowness in the first arrivals due to the change in $S_{wr}=0.3$ is 0.157 ms, higher than that of 0.084 ms reported early in. Intelligent selection of seismic survey can improve the sensitivity to $S_{wr}$ and thus increase the possibility of inversion of $S_{wr}$. However, sensitivity to $j_b$ remains poor when only first arrival-time measurements are used for seismic monitoring. The values for sensitivity given above were obtained for a reservoir model where the velocity contrast between the formation and overburden and underburden are small. Comparing the magnitudes of travel-time and velocity perturbations between the high velocity contrast case and the low velocity contrast case, we find that the magnitudes of deviation are very comparable and similar conclusions hold true.

Sensitivity Based on Full Waveforms

Full waveforms carry a lot more information about the rock and formation properties. Full waveform modeling allows the comparison of the entire wave as oppose to the direct arrivals in Eikonal solver or ray solvers. Therefore, overall sensitivity to petrophysical parameters can be better evaluated. However, if the attenuation is substantially different from the assumptions incorporated in the computations, a substantial error in inversion may result.

In the process of testing the sensitivity of petrophysical properties based on full waveform model, we use different injection rate and different source and receiver pairs. The new source and receiver locations can be found in. Also, we reduce the number of over burden to one and made the overburden and underburden acoustic properties as K=43.5 GPa, G=17.8 GPa, $\phi=0.2$ and $\rho_{u,o}=2.75$ g/cc. The properties of the saline aquifer are slightly different from the first case: K=23.68 GPa, G=10.29 GPa, $\phi=0.2$ and $\rho=2.66$ g/cc.

A total of 7900 tonnes of $CO_2$ is injected in 10 days through the interval from 1630 to 1635 m. The simulation is continued for another 40 days post-injection migration of $CO_2$.

Waveform Modeling

Waveforms are simulated using the finite-difference code in cross-well geometry. The finite-difference scheme is fourth order in space and uses a uniform square grid. It has Kosloff boundary conditions on all sides. Waveform code is integrated to the flow and fluid substitution codes so that the deviations in the effective velocity profiles due to $CO_2$ injection can be readily obtained using the temperature, pressure and saturation profiles from the simulator. However, the flow is simulated on a different grid. The flow-grid is finer close to the borehole and coarser with increasing radial distance. Also, acoustic waves travel beyond the fluid flow region. Therefore the acoustic gridding must include over- and under-burden. We extend the fluid-flow region to simulate the waveforms outside the fluid flow region by adding over-burden and under-burden layers. Also, a buffer zone of 50 grid points is added on to the left and right of the model. The seismic properties of the over- and under-burden are assumed to be constant with time.

Synthetic seismic data is collected in 10 and 50 days, and compared with baseline seismic data. Sources are located in the injection well. We used 5 sources and 14 receivers. The sources are located in the vertical injection well. Four of the sources are placed at a spacing of 15 m from 5 m above the top of the reservoir to 5 m below the bottom of the reservoir. An additional source is placed at the center of the reservoir. Source numbers and respective coordinates are tabulated in the. Similarly, the receivers are located in a vertical monitoring well 50 m away from the injection well. Along the vertical direction, they are placed at a spacing of 5 m, from 15 m above the top of the reservoir to 15 m below the bottom of the reservoir. The receiver numbers and respective coordinates are tabulated in the. Also, source and receiver locations are shown in. The source is a Ricker wavelet with a dominant frequency of 1500 Hz. For the present study, the source is provided as a dilatational stress-like source with no shear component. The receivers record the velocity in the radial and vertical direction at a sampling rate of $10^5$ samples per second (dt=$10^{-2}$ ins). The total recording time is 40 ms.

Unless mentioned, seismic attenuation is not accounted for in the simulation.

Wave propagation is simulated everywhere in the model (over-burden, under-burden and reservoir), whereas flow is simulated only in the reservoir. We calculate the seismic properties within the flow region grid locations using a fluid-substitution model and then use bilinear interpolation to update the seismic properties on seismic grid. During the interpolation, the seismic properties of the over- and under-burden are assumed to be constant with time.

TABLE 2

Source locations relative to the datum depth and injection wellbore.

| | Source Number | | | | |
|---|---|---|---|---|---|
| | 1 | 2 | 3 | 4 | 5 |
| Distance to the top of the reservoir(m) | −5 | 10 | 17.5 | 25 | 40 |
| Radial distance from the wellbore(m) | 0 | 0 | 0 | 0 | 0 |

TABLE 3

Receiver locations in meter relative to the datum depth in z-direction, and injection wellbore in r-direction.

| | Receiver Number | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| z coordinates | −15 | −10 | −5 | 0 | 5 | 10 | 15 | 20 | 25 | 30 | 35 | 40 | 45 | 50 |
| r coordinates - datum depth | 50 | 50 | 50 | 50 | 50 | 50 | 50 | 50 | 50 | 50 | 50 | 50 | 50 | 50 |

Sensitivity Metrics

For studying sensitivity, we compared the waveforms from perturbed models to the reference model through the following metrics.

1. Amplitude Misfit (A.M.):

Amplitude Misfit is measured by summing the square of the logarithm of the ratio of $l_2$-norms of waveforms corresponding to perturb and reference model for all source-receiver pairs. It is given by $$O_{AM} = \sum_{s=1}^{N_s} \sum_{r=1}^{N_r} \left[ \ln \left( \frac{\sqrt{\int_T \bar{d}(x_s, x_r, t)^2 dt}}{\sqrt{\int_T d(x_s, x_r, t)^2 dt}} \right) \right]^2 \quad (1)$$

Where $d(x_s, x_r, t)$ and $\bar{d}(x_s, x_r, t)$ are the reference model and perturbed model waveforms, respectively, corresponding to the $r^{th}$ receiver and $s^{th}$ source; $N_r$ and $N_s$ the number of receivers and sources, respectively; T is the total recording time of each trace. Amplitude misfit is more sensitive to the changes in amplitude.

2. Waveform Misfit (W.M.):

Waveform Misfit is measured by taking the square root of the sum of the squares of the residual between the reference waveforms and perturbed waveforms, and normalizing it with the $l_2$-norm of the reference waveforms. It is given by $$O_{WM} = 100 \sqrt{\frac{\sum_{s=1}^{N_s} \sum_{r=1}^{N_r} \int_T (d(x_s, x_r, t) - \tilde{d}(x_s, x_r, t))^2 dt}{\sum_{s=1}^{N_s} \sum_{r=1}^{N_r} \int_T d(x_s, x_r, t)^2 dt}}$$

Waveform misfit includes both amplitude and phase information and is the traditionally used misfit function for full waveform inversion, without the normalization factor.

3. Travel Time Misfit (T.M.):

A common way to detect phase changes in waveforms is to cross-correlate them for different time-lags and take the time-lag corresponding to the maximum correlation as a measure of phase change. This emphasizes the phase shift. In this approach, maximum correlation value is dominated by the largest amplitude arrival and the information from other arrivals is lost. To remedy this problem, the common practice in travel time tomography is to pick the arrivals, window the waveforms about the arrivals, and determine the time lag corresponding to each window. When the waveforms correlate, time-lag for all these windows will be zero. This way, phase information from different arrivals in the entire waveform is preserved. Additionally, even in the case when all the arrivals have the same amplitude, different arrivals may have different phase-shifts (positive or negative) and cross-correlating the entire waveform will not give desired results.

To pick different time windows, we identify all the peaks and troughs above a threshold value (3% of the maximum amplitude in the trace) in traces corresponding to all source-receiver pairs, for the reference model. From these peaks and troughs, only those peaks and troughs that have the largest amplitude, within a time interval $2T_c$ before the arrival time of that peak/trough to $3T_c$ after the arrival time, are selected. Here, $T_c$ is the time period corresponding to the central frequency. Time windows are selected about all the selected peaks/troughs within a range of $2T_c$, $3T_c$ before and after the arrival time of each peak/trough, respectively. Windowed reference model traces are then cross-correlated with the windowed perturbed model traces for different time lags. The cross-correlation between the $w^{th}$ windowed reference and perturbed traces, corresponding to $r^{th}$ receiver and $s^{th}$ source, for a e lag, $\tau$, is defined as below:

$$R_{mp}^{rsw}(\tau) = \frac{\int_{T_w} d_w(x_s, x_r, t)\tilde{d}(x_s, x_r, t+\tau)dt}{\sqrt{\int_{T_w} d_w(x_s, x_r, t)^2 dt} \sqrt{\int_{T_w} \tilde{d}_w(x_s, x_r, t)^2 dt}},$$

where $T_w$ is the length of the time window. Cross-correlation is normalized such that the correlation coefficient, $R_{mp}^{rsw}$, is unity for zero time lag, when the traces are identical. Travel time misfit is measured as the $l_2$-norm of the time lags corresponding to the maximum cross-correlation for all time-windows and for all source-receiver pairs.

$$O_{TM} = \sum_{s=1}^{N_s} \sum_{r=1}^{N_r} \sum_{w=1}^{N_w} (\tau_{max}^{rsq})^2,$$

where $(\tau_{max}^{rsw})$ is the time lag corresponding to the maximum cross-correlation $(\max_\tau R_{mp}^{rsw}(\tau))$; $N_w$ is the number of windows in the trace corresponding to $r^{th}$ receiver and $s^{th}$ source. A method, Coda Wave Interferometry, was described by Snieder et al. to determine velocity perturbations using multiply scattered waves. Unlike the first two measures, travel time misfit has dimensions of time and gives an idea of measurable change. To be able to compare the changes in waveform due to travel time misfit comparable to sampling time shows insensitivity to the change in the model parameter.

Reference Model

Similar to the direct arrival study, we selected a reference model with the petrophysical properties of $S_{wr}=0.1$, $S_{orm}=0.3$, $j_b=0.2$, $k_v=200$ mD and $k_h=200$ mD (shown as underlined in). We started with a simple model where the initial seismic properties of the reservoir and over/underburden are the same as the reservoir. This is to limit the head waves and reflections at the interfaces. It helps to better characterize the deviations in velocities due to the presence of $CO_2$. The initial velocity and density profiles in the reservoir are shown in Figure. At the end of ten days of injection and 50 days of monitoring, the computed seismic velocity and density profiles based on reservoir flow are shown in FIG. 21. Post-injection, $CO_2$ migrates to the top of the reservoir. In general, presence of $CO_2$ causes a significant change in $V_p$ (about 10%) when compared to $V_s$ (about 1.5%). FIG. 22 shows the seismograms for different source receiver pairs for different monitoring times (t=0, 10, 50 days). There are noticeable changes in seismograms between pre and post $CO_2$ injection.

TABLE 3

Different values of the parameters for which the simulations are run are shown in the Table. The values in red are the values corresponding to the reference model. In each simulation, one parameter is varied keeping the rest same as that of reference model.

| Parameter | Values |
| --- | --- |
| $S_{wr}$ | 0.05, 0.10, 0.20, 0.3, 0.4, 0,5 |
| $S_{orm}$ | 0.05, 0.15, 0.25, 0.3, 0.35 |
| $j_b$ | 0.05, 0.10, 0.15, 0.2, 0.25, 0.3 |
| $k_v$(MD) | 10, 50, 100, 150, 200, 350, 500, 1000, 2000 |
| $k_h$(mD) | 10, 50, 100, 150, 200, 350, 500, 1000, 2000 |

Sensitivity to Petrophysical Parameters

Sensitivity of waveforms to petrophysical parameters is estimated by changing one petrophysical parameter at a time and comparing the shift in the waveforms with those from the reference model. The values used in the simulations, are given in. When a parameter is changed it alters the saturation, density and pressure profiles in the reservoir. As a result, the seismic attributes are altered in the reservoir resulting in changes in waveforms. For analyzing sensitivity to petrophysical parameters, we used both the Gassmann and patchy saturation approaches for effective medium calculations and we report the results from Gassmann approach. Both approaches show similar sensitivity.

We considered seismic simulations in two settings. First, we consider a homogeneous case in which there is no seismic impedance contrast between reservoir and over/under-burden before injection. Though it is not realistic for over/under-burden to have the same seismic properties as reservoir, it helps us to understand the deviations due to $CO_2$ saturation better in the absence of multiple reflections and head waves. Second, we consider a layered case, a real scenario, where over and under-burden layers have different seismic attributes and results in reflections from top, bottom and head waves. Both the cases, share the same reservoir seismic attributes at all times and are derived from the same flow simulations. We assume that the seismic attributes of overburden and under-burden remain constant with time while those of the reservoir change due to $CO_2$ injection.

1. Homogeneous Case

The seismograms for the homogeneous case, when reference model is used for flow simulation, are presented in FIG. 20. Initially, at t=0, we just see the direct arrivals at all the receivers. Direct arrivals follow a hyperbolic moveout. As $CO_2$ front advances (at t=10, 50 days), the reservoir seismic velocity within the $CO_2$ region is reduced and creates a velocity contrast between over/under-burden and the reservoir. As a result, we have reflections from the top and bottom of the $CO_2$ region that show up in the seismograms at later times. These reflections traverse longer distances in the $CO_2$ saturated region and are more susceptible to changes in petrophysical parameters. Moreover, post-injection $CO_2$ migrates to the top of the reservoir and the reflection from the top is more dominant at t=50 days.

At t=10 days FIGS. 1, 6 and 7 show the sensitivity of waveforms to alteration in petrophysical parameters using amplitude misfit, waveform misfit and travel time misfit respectively, and are seen to have similar sensitivity. $j_b$ is an exception and shows little influence in altering the waveforms in terms misfit magnitude. Also, we do not see sensitivity to $S_{orm}$ during injection since it does not affect the flow pattern. We can see that when amplitude misfit is used as a metric, the deviation in waveforms due to attenuation is much larger than that due to petrophysical parameters. This difference is reduced when waveform misfit is taken as a metric. However, when travel time misfit is taken as a metric, the deviations in the waveforms due to the uncertainty in attenuation is minimized and we have more sensitivity to petrophysical parameters. Therefore, travel time misfit will be used as a preferred metric to study sensitivity.

FIG. 3 shows the post-injection (at t=50 days) sensitivity to petrophysical parameters. We can see that waveforms are sensitive to perturbations in $S_{orm}$ and the deviation in waveforms is of the same order as $S_{wr}$.

2. Layered Case

Now, we consider the case when over and under-burden have higher seismic velocities compared to the reservoir. The initial velocity model is described in the previous section. FIG. 23 shows the seismograms for all source-receiver pairs when over and underburden layers have higher seismic velocities. Since the reservoir is a low-velocity region, sandwiched between high-velocity layers, most of the seismic energy is trapped within the reservoir when sources are within the reservoir. For the same reasons, when sources are in the over and under-burden layer, it is hard to propagate energy into the reservoir. As a result, we have strong reflections at the interfaces. Different arrivals are marked on the seismograms in FIG. 23. We have direct arrivals that pass through the $CO_2$ infiltrated zone and as a consequence the arrivals have a time lag compared to initial time. At the same time, the reflections travel for a longer distance through the $CO_2$ zone and have relatively larger travel time perturbations. With more multiples we have more of the $CO_2$ zone sampled and a better sensitivity.

FIGS. 2 and 4 show the sensitivity at t=10 days and t=50 days. When compared to homogeneous case, the relative sensitivities to different petrophysical parameters remain the same. However, the measurable deviation increases due to the presence of multiples. So, in the layered case we have a better chance to invert for petrophysical parameters than the homogeneous case.

We claim:

1. A method for characterizing a property of a subterranean porous rock formation filled with a fluid, the method comprising:
   collecting well log and seismic data for the subterranean porous rock formation;
   using the well log and seismic data to determine initial petrophysical parameters and layers for the subterranean porous rock formation;
   upscaling the initial petrophysical parameters for the layers within the subterranean porous rock formation;
   running a flow simulation using the upscaled petrophysical parameters and the layers to generate saturation, pressure and temperature values for the fluid within the subterranean porous rock formation;

determining effective velocities for the subterranean porous rock formation filled with the fluid from the saturation, pressure and temperature values for the fluid generated by the flow simulation; and updating a seismic model for the subterranean porous rock formation using the effective velocities.

2. The method of claim 1, further comprising generating synthetic data using the seismic model.

3. The method of claim 2, wherein the synthetic data comprises synthetic seismic data.

4. The method of claim 3, wherein generating the synthetic seismic data comprises using a full seismic waveform model.

5. The method of claim 3, wherein generating the synthetic seismic data comprises using a ray tracing model.

6. The method of claim 2, further comprising determining new petrophysical parameters for the subterranean porous rock formation by comparing the synthetic data to observed data.

7. The method of claim 6, further comprising using the new petrophysical parameters to predict hydrocarbon recovery from the subterranean porous rock formation.

8. The method of claim 6, wherein the new petrophysical parameters are determined by minimizing a difference between the synthetic data and observed data.

9. The method of claim 6, further comprising generating a reservoir model using the new petrophysical parameters.

10. The method of claim 9, further comprising using the reservoir model to simulate $CO_2$ injection into the subterranean porous rock formation.

11. The method of claim 9, further comprising using the reservoir model to select a $CO_2$ storage site.

12. The method of claim 9, further comprising using the reservoir model for simulating $CO_2$ presence in the subterranean porous rock formation.

13. The method of claim 12, further comprising using the reservoir model to quantify $CO_2$ properties in the subterranean porous rock formation.

14. The method of claim 12, further comprising using the reservoir model to estimate $CO_2$ storage capacity of the subterranean porous rock formation.

15. The method of claim 12, further comprising using the reservoir model to predict fluid front arrival in the subterranean porous rock formation.

16. The method of claim 12, further comprising using the reservoir model to predict fluid movement in the subterranean porous rock formation.

17. The method of claim 12, further comprising using the reservoir model to generate fluid saturation profiles in the subterranean porous rock formation.

18. The method of claim 12, further comprising using the reservoir model to predict $CO_2$ injectivity.

19. The method of claim 12, further comprising using the reservoir model to predict fluid pressure in the subterranean porous rock formation.

20. The method of claim 12, further comprising using the reservoir model to predict $CO_2$ profile evolution over time in the subterranean porous rock formation.

21. The method of claim 20, wherein the $CO_2$ profile evolution over time comprises a spatial distribution of the $CO_2$ in the subterranean porous rock formation.

22. The method of claim 20, further comprising predicting $CO_2$ profile evolution over time in the subterranean porous rock formation for risk assessment.

* * * * *